United States Patent
Ejiri et al.

(10) Patent No.: US 12,070,800 B2
(45) Date of Patent: Aug. 27, 2024

(54) ELECTRONIC COMPONENT AND METHOD FOR MANUFACTURING ELECTRONIC COMPONENT

(71) Applicant: Showa Denko Materials Co., Ltd., Tokyo (JP)

(72) Inventors: Yoshinori Ejiri, Tokyo (JP); Shinichirou Sukata, Tokyo (JP); Masaya Toba, Tokyo (JP); Hideo Nakako, Tokyo (JP); Yuki Kawana, Tokyo (JP); Kosuke Urashima, Tokyo (JP); Motoki Yonekura, Tokyo (JP); Takaaki Nohdoh, Tokyo (JP); Yoshiaki Kurihara, Tokyo (JP); Hiroshi Masuda, Tokyo (JP); Keita Sone, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 466 days.

(21) Appl. No.: 17/274,788

(22) PCT Filed: Sep. 5, 2019

(86) PCT No.: PCT/JP2019/035039
§ 371 (c)(1),
(2) Date: Mar. 10, 2021

(87) PCT Pub. No.: WO2020/054581
PCT Pub. Date: Mar. 19, 2020

(65) Prior Publication Data
US 2022/0053647 A1    Feb. 17, 2022

(30) Foreign Application Priority Data
Sep. 14, 2018 (JP) ................. 2018-172332

(51) Int. Cl.
*B22F 7/08* (2006.01)
*B22F 1/052* (2022.01)
(Continued)

(52) U.S. Cl.
CPC ................ *B22F 7/08* (2013.01); *B22F 1/052* (2022.01); *H05K 1/181* (2013.01); *H05K 3/1283* (2013.01);
(Continued)

(58) Field of Classification Search
CPC ........................................ B22F 7/08
(Continued)

(56) References Cited

U.S. PATENT DOCUMENTS

2004/0140549 A1* 7/2004 Miyagawa ........... H05K 3/4664
257/690
2008/0145607 A1    6/2008 Kajiwara et al.
(Continued)

FOREIGN PATENT DOCUMENTS

CN    103843469    6/2014
CN    104412724    3/2015
(Continued)

*Primary Examiner* — Stanley Tso
(74) *Attorney, Agent, or Firm* — JCIPRNET

(57) ABSTRACT

One aspect of the present invention is a method for manufacturing an electronic component, the method including: a first step of applying a metal paste containing metal particles onto a polymer compact in a prescribed pattern to form a metal paste layer; a second step of sintering the metal particles to form metal wiring; a third step of applying a solder paste containing solder particles and a resin component onto the metal wiring to form a solder paste layer; a fourth step of disposing an electronic element on the solder paste layer; and a fifth step of heating the solder paste layer so as to form a solder layer bonding the metal wiring and the
(Continued)

electronic element, and so as to form a resin layer covering at least a portion of the solder layer.

6 Claims, 13 Drawing Sheets

(51) Int. Cl.
  *H05K 1/18* (2006.01)
  *H05K 3/12* (2006.01)
  *H05K 3/34* (2006.01)
  *H05K 1/03* (2006.01)
  *H05K 1/09* (2006.01)

(52) U.S. Cl.
  CPC ......... *H05K 3/3463* (2013.01); *H05K 3/3485* (2020.08); *H05K 1/032* (2013.01); *H05K 1/0333* (2013.01); *H05K 1/09* (2013.01); *H05K 2201/0141* (2013.01)

(58) Field of Classification Search
  USPC ........................................................ 361/779
  See application file for complete search history.

(56) References Cited

U.S. PATENT DOCUMENTS

| | | | |
|---|---|---|---|
| 2013/0316170 A1* | 11/2013 | Uchiyama | C09J 175/14 524/436 |
| 2014/0218886 A1 | 8/2014 | Nomura et al. | |
| 2015/0163903 A1* | 6/2015 | Wada | H05K 1/0313 361/760 |
| 2017/0047302 A1 | 2/2017 | Morita et al. | |
| 2017/0252869 A1 | 9/2017 | Fritzsche et al. | |
| 2018/0250751 A1* | 9/2018 | Kawana | B22F 1/10 |

FOREIGN PATENT DOCUMENTS

| | | | |
|---|---|---|---|
| CN | 106660176 | | 5/2017 |
| CN | 107921540 | | 4/2018 |
| JP | 2005093105 | * | 4/2005 |
| JP | 2007237212 | * | 7/2007 |
| JP | 2007237212 | | 9/2007 |
| JP | 2012149347 | | 8/2012 |
| JP | WO2013021750 | * | 2/2013 |
| JP | 2015220422 | | 12/2015 |
| JP | 2017123254 | | 7/2017 |
| JP | 6300213 | | 3/2018 |
| JP | 2018074055 | | 5/2018 |
| WO | 2013021750 | | 2/2013 |
| WO | 2016035513 | | 3/2016 |

* cited by examiner (a)

(b)

ELECTRONIC COMPONENT AND METHOD FOR MANUFACTURING ELECTRONIC COMPONENT

CROSS-REFERENCE TO RELATED APPLICATION

This application is a 371 application of the international PCT application serial no. PCT/JP2019/035039, filed on Sep. 5, 2019, which claims the priority benefits of Japan application no. 2018-172332, filed on Sep. 14, 2018. The entirety of each of the above-mentioned patent applications is hereby incorporated by reference herein and made a part of this specification.

TECHNICAL FIELD

The present invention relates to an electronic component and a method for manufacturing an electronic component.

DESCRIPTION OF RELATED ART

In recent years, studies have been underway regarding methods of forming a metal layer on the surface of a polymer compact by plating for the purpose of a functional and/or decorative surface process. For example, in the case of forming a metal wiring on a polymer compact, since there is a need to form the metal wiring in a prescribed pattern, as a method for selective metal plating, laser direct structuring (LDS) is useful. For example, in the case of forming a copper wiring by LDS, laser beams are radiated on a part of a polymer compact containing a catalyst, at which the copper wiring is to be formed, to activate the catalyst, whereby it is possible to perform electroless copper plating on the catalyst selectively (only in the part at which the copper wiring is to be formed), and consequently, it is possible to form the copper wiring having a prescribed pattern (for example, Patent Literature 1). Meanwhile, a method in which a paste containing copper is applied onto a polymer compact and calcinated, thereby easily forming a copper wiring has been proposed (for example, Patent Literature 2).

REFERENCE LIST

Patent Literature

Patent Literature 1: Japanese Laid-open Patent Publication No. 2012-149347
Patent Literature 2: Japanese Laid-open Patent Publication No. 2017-123254

SUMMARY

Technical Problem

The methods of forming a copper wiring by LDS has a problem with productivity since polymers containing a catalyst are expensive and laser radiation and an electroless copper plating step are required. Meanwhile, in the method in which a metal paste is applied onto a polymer compact and calcinated, thereby easily forming a metal wiring, adhesiveness between the polymer compact and the metal wiring cannot be sufficiently obtained, and the adhesion strengths of electronic components are likely to degrade.

Therefore, an objective of one aspect of the present invention is to provide an electronic component and a method for manufacturing an electronic component in which the formation of a metal wiring and the mounting of an electronic element are easily performed and the adhesion strength is high.

Solution to Problem

One aspect of the present invention is a method for manufacturing an electronic component, the method including a first step of applying a metal paste containing metal particles onto a polymer compact in a prescribed pattern to form a metal paste layer, a second step of sintering the metal particles to form a metal wiring, a third step of applying a solder paste containing solder particles and a resin component onto the metal wiring to form a solder paste layer, a fourth step of disposing an electronic element on the solder paste layer, and a fifth step of heating the solder paste layer so as to form a solder layer bonding the metal wiring and the electronic element, and so as to form a resin layer covering at least a portion of the solder layer.

In this manufacturing method, since the metal paste is applied in a prescribed pattern (a pattern corresponding to the metal wiring), a polymer containing a catalyst is not necessary, and it is possible to skip laser radiation and the electroless copper plating step. Additionally, in this manufacturing step, the solder paste is applied onto the metal wiring formed by calcinating the metal paste, the electronic element is disposed, and then the solder paste is thermally treated, whereby the metal wiring and the electronic element are bonded to each other through the solder layer, and the resin layer is formed in the outer circumference of the solder layer, which enables improvement in the adhesiveness between the polymer compact and the metal wiring.

In the second step, the metal wiring may have pores. In the third step, at least some of the pores in the metal wiring may be loaded with the resin component.

The solder particles may be a component containing tin. The solder particles may be an alloy made of an In—Sn alloy, an In—Sn—Ag alloy, a Sn—Bi alloy, a Sn—Bi—Ag alloy, a Sn—Ag—Cu alloy, or a Sn—Cu alloy.

The metal particles may be formed of at least one metal selected from the group consisting of copper, nickel, palladium, gold, platinum, silver, and tin. The metal particles may include first metal particles having a particle diameter of 2.0 µm or more and second metal particles having a particle diameter of 0.8 µm or less.

The polymer compact may be made of a liquid crystal polymer or polyphenylene sulfide.

The electronic element may have an electrode containing at least one element selected from copper, nickel, palladium, gold, platinum, silver, and tin on an outermost surface, and, in the fourth step, the electronic element may be disposed such that the electrode is in contact with the solder paste layer.

Another aspect of the present invention is an electronic component including a polymer compact, a metal wiring provided on the polymer compact and made of a sintered body of metal particles, an electronic element disposed on the metal wiring, a solder layer bonding the metal wiring and the electronic element, and a resin layer that covers at least a portion of the solder layer and is made of a cured product of a resin component.

Advantageous Effects of Invention

According to one aspect of the present invention, it is possible to easily perform the formation of a metal wiring and the mounting of an electronic element and to obtain favorable adhesiveness between the metal wiring and a polymer compact.

DESCRIPTION OF EMBODIMENTS

Figure 1:
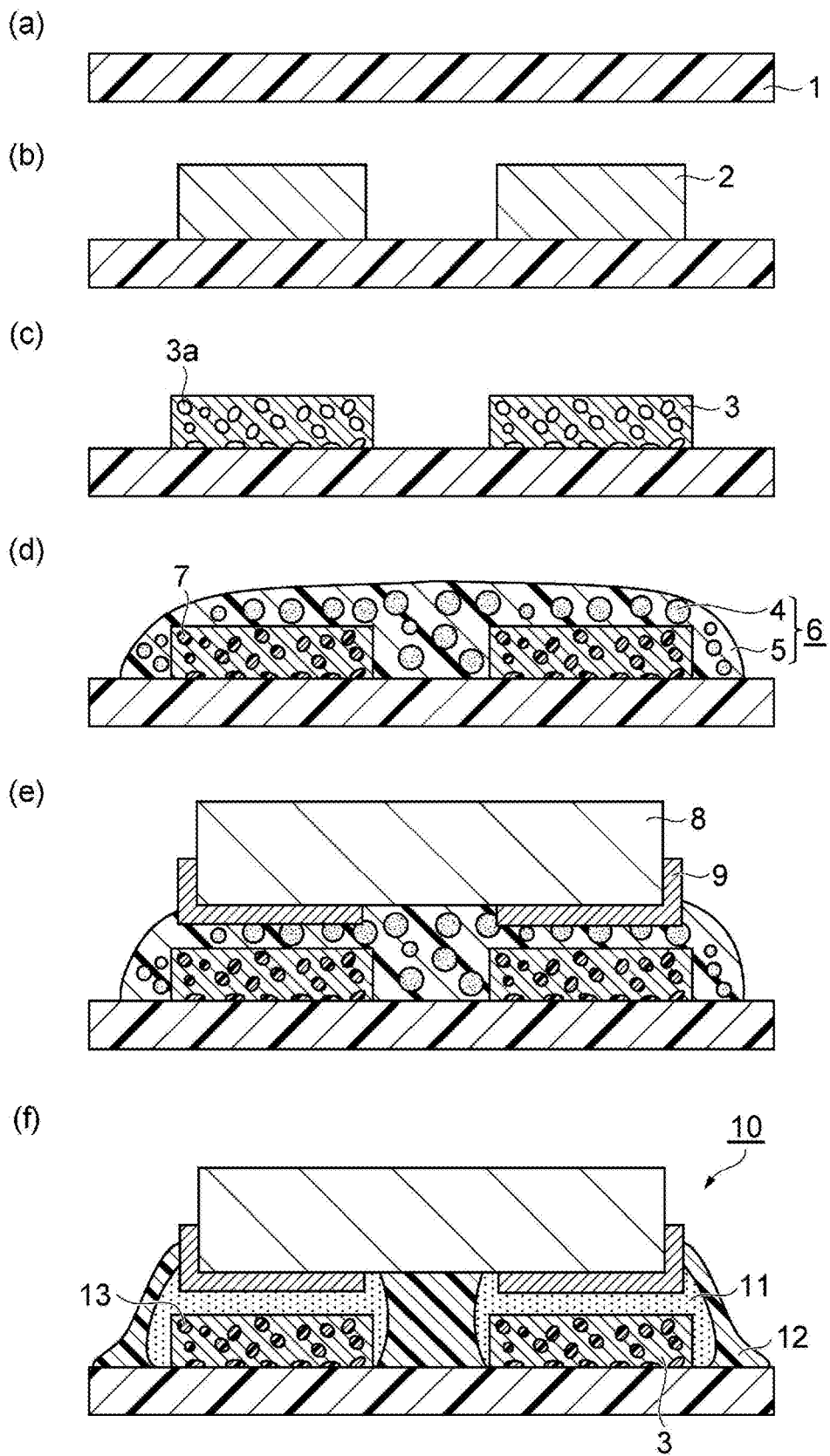
FIG. 1 is schematic cross-sectional views showing a method for manufacturing an electronic component of an embodiment.

Hereinafter, embodiments for carrying out the present invention will be described in detail with reference to the drawings. The present invention is not limited to the following embodiments. In the drawings, the same or equivalent portions will be given the same reference signs and will not be described again.

A method for manufacturing an electronic component of the present embodiment is a method for manufacturing an electronic component, the method including a first step of applying a metal paste containing metal particles onto a polymer compact in a prescribed pattern to form a metal paste layer, a second step of sintering the metal particles to form a metal wiring, a third step of applying a solder paste containing solder particles and a resin component onto the metal wiring to form a solder paste layer, a fourth step of disposing an electronic element on the solder paste layer, and a fifth step of heating the solder paste layer so as to form a solder layer bonding the metal wiring and the electronic element, and so as to form a resin layer covering at least a portion of the solder layer.

The metal particles preferably contain at least one metal selected from the group consisting of copper, nickel, palladium, gold, platinum, silver, and tin. The metal particles preferably contain copper or silver since copper or silver is easily sintered at low temperatures and more preferably contain copper from the viewpoint of suppressing migration when used to form fine wirings. When calcination at low temperatures and the material cost are taken into account, as the metal particles, silver-coated copper particles are more preferably used. One kind of metal particles may be used singly or two or more kinds of metal particles may be used in combination. In addition, the metal particles may include two or more kinds of metal particles having different particle diameters and may include, for example, first metal particles having a particle diameter of 2.0 μm or more and second metal particles having a particle diameter of 0.8 μm or less.

FIG. 1 is schematic views showing a method for manufacturing an electronic component of an embodiment. The case of using copper particles as the metal particles for forming a metal wiring will be described. In this manufacturing method, first, a copper paste containing copper particles is applied onto a polymer compact in a prescribed pattern to form a metal (copper) paste layer (first step). In the first step, first, a polymer compact 1 is prepared as shown in (a) of FIG. 1 (preparation step).

The polymer compact 1 is a compact formed by a well-known method using, for example, a polymer such as a polyamide (PA), polybutylene terephthalate (PBT), polycarbonate (PC), polyetherimide (PEI), polyphenylene sulfide (PPS), polyetheretherketone (PEEK), or a liquid crystal polymer (LCP). The shape and size of the polymer compact are arbitrary. The polymer compact 1 is preferably formed of a liquid crystal polymer (LCP) or polypropylene sulfide (PPS).

(First Step)

In the first step, subsequent to the preparation step, as shown in (b) of FIG. 1, a copper paste is applied onto the polymer compact 1 in a prescribed pattern (onto in the part at which a copper wiring is to be formed) to form copper paste layers 2 (formation step). The copper paste is applied by, for example, screen printing, transfer printing, offset printing, a jet printing method, a dispenser, a jet dispenser, a needle dispenser, a comma coater, a slit coater, a die coater, a gravure coater, slit coating, relief printing, intaglio printing, gravure printing, stencil printing, soft lithography, bar coating, an applicator, a particle deposition method, a spray coater, a spin coater, a dip coater, electrodeposition coating, or the like.

The thickness of the copper paste layer may be 1 μm or more, 2 μm or more, 3 μm or more, 5 μm or more, 10 μm or more, 15 μm or more, or 20 μm or more and may be 3000 μm or less, 1000 μm or less, 500 μm or less, 300 μm or less, 250 μm or less, 200 μm or less, 150 μm or less, or 100 μm or less.

In the formation step, from the viewpoint of suppressing the flux of the copper particles during sintering and the generation of a void, the copper paste layers 2 provided on the polymer compact 1 may be appropriately dried. The gas atmosphere during drying may be the atmosphere, may be an oxygen-free atmosphere filled with nitrogen, a rare gas, or the like, or may be a reducing atmosphere filled with hydrogen, formic acid, or the like. The drying method may be drying by leaving the copper paste layer 2 at room temperature, heating drying, or reduced-pressure drying. For heating drying or reduced-pressure drying, it is possible to use, for example, a hot plate, a hot air dryer, a hot air heating furnace, a nitrogen dryer, an infrared dryer, an infrared heating furnace, a far infrared heating furnace, a microwave heating device, a laser heating device, an electromagnetic heating device, a heater heating device, a steam heating furnace, a hot plate press device, or the like. The temperature and time of the drying may be appropriately adjusted depending on the kind and amount of a dispersion medium used. The temperature of the drying may be, for example, 50° C. or higher and 180° C. or lower. The time of the drying may be, for example, one minute or longer and 120 minutes or shorter.

The copper paste contains, as the copper particles, for example, first copper particles having a particle diameter (maximum diameter) of 2.0 μm or more. The particle diameter (maximum diameter) of the first copper particles is 2.0 μm or more and may be, for example, 3.0 μm or more. The particle diameter of the first copper particles may be 20 μm or less or may be 10 μm or less. The average particle diameter (average maximum diameter) of the first copper particles may be 1.0 μm or more or 3 μm or more and may be 20 μm or less or may be 10 μm or less from the viewpoint of further suppressing breaking caused by thermal stress in a wiring to be obtained.

The particle diameters and average particle diameter of the first copper particles can be obtained from, for example, a SEM image of the particles. A method for calculating the particle diameter (maximum diameter) of the first copper particles from a SEM image will be exemplified. The powder of the first copper particles is placed on a carbon tape for a SEM with a spatula to produce a sample for the SEM. This sample for the SEM is observed with the SEM at a magnification of 5000 times. Rectangles circumscribing the first copper particles in a SEM image are drawn with image processing software, and the long sides of the rectangles are regarded as the particle diameters (maximum diameters) of the particles. This measurement is performed on 50 or more first copper particles using a plurality of SEM images, and the average value (average maximum diameter) of the particle diameters is calculated.

The volume-average particle diameter of the first copper particles may be 2.0 μm or more or 3.0 μm or more and may be 50 μm or less, 20 μm or less, or 10 μm or less. In the present specification, the volume-average particle diameter refers to the 50% volume-average particle diameter. In the case of obtaining the volume-average particle diameter of the copper particles, the volume-average particle diameter can be obtained by a method in which copper particles that serve as a raw material or dried copper particles obtained by removing a volatile component from the copper paste are dispersed in a dispersion medium using a dispersant and the particle diameters are measured with a light scattering method particle size distribution measuring instrument (for example, Shimadzu nanoparticle size distribution measuring instrument (trade name: SALD-7500nano, manufactured by Shimadzu Corporation)), or the like. In the case of using the light scattering method particle size distribution measuring instrument, it is possible to use hexane, toluene, α-terpineol, or the like as the dispersion medium.

The first copper particles preferably have a flake shape. In this case, the first copper particles are oriented substantially parallel to the surface to which the copper paste is applied, whereby volume contraction occurring at the time of sintering the copper particles in the copper paste is suppressed, and breaking caused by thermal stress in a wiring to be obtained is further suppressed. In addition, while the reason therefor is not clear, the adhesiveness between a copper wiring and the polymer compact further improves.

The aspect ratios of the first copper particles may be four or more or may be six or more. When the aspect ratios are within the above-described range, the first copper particles in the copper paste are likely to be oriented parallel to the surface to which the copper paste is applied, and it is possible to suppress volume contraction occurring at the time of sintering the copper particles in the copper paste. Therefore, it is possible to further suppress breaking caused by thermal stress in a wiring to be obtained. The aspect ratios (long diameter/thickness) of the copper particles in the copper paste can be obtained by, for example, observing a SEM image of the particles and measuring the long diameters and the thicknesses.

The copper paste preferably contains the first copper particles having a particle diameter of 2.0 μm or more and 50 μm or less and an aspect ratio of four or more. When the average particle diameter and aspect ratios of the first copper particles are within the above-described ranges, it is possible to sufficiently reduce volume contraction occurring at the time of sintering the copper particles in the copper paste and to further suppress breaking caused by thermal stress in a wiring to be obtained.

The copper paste may contain copper particles having a particle diameter of 2.0 μm or more and 50 μm or less and an aspect ratio of less than two, but the content of the copper particles having a particle diameter of 2.0 μm or more and 50 μm or less and an aspect ratio of less than two is preferably 50 parts by mass or less and more preferably 30 parts by mass or less with respect to 100 parts by mass of the first copper particles having a particle diameter of 2.0 μm or more and 50 μm or less and an aspect ratio of four or more. The content of the copper particles having an average particle diameter of 2.0 μm or more and 50 μm or less and an aspect ratio of less than two is limited, whereby the first copper particles in the copper paste are likely to be oriented substantially parallel to the surface to which the copper paste is applied, and it is possible to more effectively suppress volume contraction occurring at the time of sintering the copper particles in the copper paste. Therefore, it becomes easy to further suppress breaking caused by thermal stress in a wiring to be obtained. Since it becomes easier to obtain such effects, the content of the copper particles having an average particle diameter of 2.0 μm or more and 50 μm or less and an aspect ratio of less than two may be 20 parts by mass or less, may be 10 parts by mass or less, and may be 0 parts by mass with respect to 100 parts by mass of the first copper particles having a particle diameter of 2.0 μm or more and 50 μm or less and an aspect ratio of four or more.

The content of the first copper particles in the copper paste may be 1% by mass or more, 10% by mass or more, or 20% by mass or more and may be 90% by mass or less, 70% by mass or less, or 50% by mass or less based on the total mass of metal particles contained in the copper paste. When the content of the first copper particles is within the above-described range, the formation of a wiring having excellent conduction reliability becomes easy.

The first copper particles may be treated with a surface treatment agent from the viewpoint of the dispersion stability and the oxidation resistance. The surface treatment agent may be a component that is removed during the formation of wirings (during the sintering of the copper particles). Examples of the surface treatment agent include aliphatic carboxylic acids such as palmitic acid, stearic acid, arachidic acid, and oleic acid; aromatic carboxylic acids such as terephthalic acid, pyromellitic acid, and o-phenoxybenzoic acid; aliphatic alcohols such as cetyl alcohol, stearyl alcohol, isobornyl cyclohexanol, and tetraethylene glycol; aromatic alcohols such as p-phenylphenol; alkylamines such as octylamine, dodecylamine, and stearylamine; aliphatic nitriles such as stearonitrile and decanenitrile; silane coupling agents such as alkylalkoxysilane; and polymer treatment agents such as polyethylene glycol, polyvinyl alcohol, polyvinylpyrrolidone, and silicone oligomer. One kind of surface treatment agent may be used singly or two or more kinds of surface treatment agents may be used in combination.

The amount of the surface treatment agent used for the treatment may be an amount large enough to form at least one molecular layer on the particle surfaces. Such an amount of the surface treatment agent used for the treatment varies with the specific surface area of the first copper particles, the molecular weight of the surface treatment agent, and the minimum coating area of the surface treatment agent. The amount of the surface treatment agent used for the treatment is ordinarily 0.001% by mass or more.

The amount of the surface treatment agent used for the treatment can be calculated from the number of molecular layers attached to the surface of the first copper particle (n), the specific surface area of the first copper particles ($A_P$) (unit: $m^2/g$), the molecular weight of the surface treatment agent ($M_S$) (unit: g/mol), the minimum coating area of the surface treatment agent ($S_S$) (unit: $m^2$/molecule), and the Avogadro's number ($N_A$) ($6.02 \times 10^{23}$ units). Specifically, the amount of the surface treatment agent used for the treatment is calculated according to an equation: the amount of the surface treatment agent used for the treatment (% by mass)=$\{(n \cdot A_P \cdot M_S)/(S_S \cdot N_A + n \cdot A_P \cdot M_S)\} \times 100\%$.

The specific surface area of the first copper particles can be calculated by measuring dried copper particles by a BET specific surface area measurement method. The minimum coating area of the surface treatment agent is $2.05 \times 10^{-19}$ $m^2$/molecule in a case where the surface treatment agent is a linear saturated aliphatic acid. In the case of the other surface treatment agents, the minimum coating areas can be measured by calculation from a molecular model or a method described in, for example, "Chemistry & Education" (Ueda Katsuhiro, Inafuku Sumio, Mori Iwao, 40(2), 1992, p. 114-117). An example of the method for determining the amount of the surface treatment agent will be described. The surface treatment agent can be identified with a thermal desorption gas chromatography mass spectrometer of dried powder obtained by removing the dispersion medium from the copper paste, whereby it is possible to determine the number of carbon atoms and molecular weight of the surface treatment agent. The percentage of the carbon component in the surface treatment agent can be analyzed by an analysis of the carbon component. Examples of a method for the analysis of the carbon component include the infrared absorption method after combustion in an induction furnace. The amount of the surface treatment agent can be calculated from the number of carbon atoms, molecular weight, and percentage of the carbon component of the identified surface treatment agent according to the above-described equation.

As the first copper particles, it is possible to use commercially available products. Examples of commercially available first copper particles include MA-C025 (manufactured by Mitsui Mining & Smelting Co., Ltd., average particle diameter of 4.1 µm), 3L3 (manufactured by Fukuda Metal Foil & Powder Co., Ltd., average particle diameter of 7.3 µm), 1110F (manufactured by Mitsui Mining & Smelting Co., Ltd., average particle diameter of 5.8 µm), and 2L3 (manufactured by Fukuda Metal Foil & Powder Co., Ltd., average particle diameter of 9 µm).

At the time of producing the copper paste, it is possible to use copper particles in which the first copper particles having a particle diameter of 2.0 µm or more and 50 µm or less and an aspect ratio of four or more are contained and the content of the copper particles having a particle diameter of 2.0 µm or more and 50 µm or less and an aspect ratio of less than two is 50 parts by mass or less and preferably 30 parts by mass or less with respect to 100 parts by mass of the first copper particles having a particle diameter of 2.0 µm or more and 50 µm or less and an aspect ratio of four or more. A commercially available product made of such copper particles may be selected and used.

In one embodiment, the copper paste may contain the first copper particles and second copper particles having a particle diameter (maximum diameter) of 0.8 µm or less. In this case, the second copper particles are interposed between the first copper particles at the time of sintering the copper particles, whereby there is a tendency that the conduction property of a wiring to be obtained improves. Particularly, in the case of using the first copper particles as the copper particles, it is preferable to jointly use the first copper particles and the second copper particles. That is, in the case of preparing a copper paste made of the second copper particles alone, since volume contraction and sintering contraction accompanied by the drying of a dispersion medium are significant, a sintered body (wiring) is likely to peel off from a surface to which the sintered body has been attached during the sintering of the copper particles, and it is difficult to obtain sufficient conduction reliability. However, when the first copper particles and the second copper particles are jointly used, volume contraction at the time of sintering the copper paste is suppressed, and the adhesiveness between a wiring to be obtained and the polymer compact, which is a body to which the wiring is to be attached, improves. Therefore, breaking caused by thermal stress in the wiring is less likely to occur.

The second copper particles act as copper particles that preferably bond the first copper particles together. In addition, the second copper particles are superior to the first copper particles in terms of the sintering property and have a function of accelerating the sintering of the copper particles. For example, compared with a case where the first copper particles are used singly, it becomes possible to sinter the copper particles at low temperatures.

The particle diameter of the second copper particles may be 0.5 µm or less, 0.4 µm or less, or 0.3 µm or less. The particle diameter of the second copper particles may be 0.01 µm or more, 0.05 µm or more, 0.1 µm or more, or 0.2 µm or more. The average particle diameter of the second copper particles may be 0.01 µm or more, 0.05 µm or more, 0.1 µm or more, or 0.2 µm or more and may be 0.8 µm or less, 0.5 µm or less, 0.4 µm or less, or 0.3 µm or less.

The volume-average particle diameter of the second copper particles may be 0.01 µm or more and may be 0.8 µm or less. When the volume-average particle diameter of the second copper particles is 0.01 µm or more, it becomes easy to obtain effects of the suppression of the synthesis cost of the second copper particles, favorable dispersibility, and the suppression of the amount of the surface treatment agent used. When the volume-average particle diameter of the second copper particles is 0.8 µm or less, it becomes easy to obtain an effect of the sintering property of the second copper particles becoming excellent. From the viewpoint of further exhibiting the above-described effects, the volume-average particle diameter of the second copper particles may be 0.05 µm or more, 0.1 µm or more, or 0.2 µm or more and may be 0.5 µm or less, 0.4 µm or less, or 0.3 µm or less.

The second copper particles may contain 10% by mass or more of copper particles having a particle diameter of 0.01 µm or more and 0.8 µm or less. From the viewpoint of the sintering property of the copper paste, the second copper particles may contain 20% by mass or more, 30% by mass or more, or 100% by mass of copper particles having a particle diameter of 0.01 µm or more and 0.8 µm or less.

When the percentage content of the copper particles having a particle diameter of 0.01 μm or more and 0.8 μm or less in the second copper particles is 20% by mass or more, the dispersibility of the copper particles further improves, and it is possible to further suppress an increase in the viscosity and a decrease in the paste concentration.

The content of the second copper particles in the copper paste may be 20% by mass or more, 30% by mass or more, 35% by mass or more, or 40% by mass or more and 90% by mass or less, 85% by mass or less, or 80% by mass or less based on the total mass of the metal particles contained in the copper paste. When the content of the second copper particles is within the above-described range, breaking caused by thermal stress in a wiring to be obtained is less likely to occur.

The content of the second copper particles in the copper paste may be 20% by mass or more and 90% by mass or less based on the total of the mass of the first copper particles and the mass of the second copper particles. When the content of the second copper particles is 20% by mass or more, it is possible to sufficiently load portions between the first copper particles with the second copper particles, and breaking caused by thermal stress in a wiring to be obtained is less likely to occur. When the content of the second copper particles in the copper paste is 90% by mass or less, since it is possible to sufficiently suppress volume contraction occurring at the time of sintering the copper particles, breaking caused by thermal stress in a wiring to be obtained is less likely to occur. From the viewpoint of further exhibiting the above-described effects, the content of the second copper particles may be 30% by mass or more, 35% by mass or more, or 40% by mass or more and 85% by mass or less or 80% by mass or less based on the total of the mass of the first copper particles and the mass of the second copper particles.

The shape of the second copper particle may be, for example, a spherical shape, a lump shape, a needle shape, a flake shape, a substantially spherical shape, or the like. The second copper particle may be an aggregate of copper particles having such a shape. The shape of the second copper particle may be a spherical shape, a substantially spherical shape, or a flake shape from the viewpoint of the dispersibility and the loading property and may be a spherical shape or a substantially spherical shape from the viewpoint of the combustion property, the mixing property with the first copper particles, and the like.

The aspect ratios of the second copper particles may be five or less or may be three or less from the viewpoint of the dispersibility, the loading property, and the mixing property with the first copper particles.

The second copper particles may be treated with a specific surface treatment agent. Examples of the specific surface treatment agent include organic acids having 8 to 16 carbon atoms. Examples of the organic acid having 8 to 16 carbon atoms include saturated aliphatic acids such as caprylic acid, methyl heptanoate, ethyl hexanoate, propyl pentanoate, pelargonic acid, methyl octanoate, ethyl heptanoate, propyl hexanoate, capric acid, methyl nonanoate, ethyl octanoate, propyl heptanoate, butyl hexanoate, undecanoic acid, methyl decanoate, ethyl nonanoate, propyl octanoate, butyl heptanoate, lauric acid, methyl undecanoate, ethyl decanoate, propyl nonanoate, butyl octanoate, pentyl heptanoate, tridecanoic acid, methyl dodecanoate, ethyl undecanoate, propyl decanoate, butyl nonanoate, pentyl octanoate, myristic acid, methyl tridecanoate, ethyl dodecanoate, propyl undecanoate, butyl decanoate, pentyl nonanoate, hexyl octanoate, pentadecanoic acid, methyl tetradecanoate, ethyl tridecanoate, propyl dodecanoate, butyl undecanoate, pentyl decanoate, hexyl nonanoate, palmitic acid, methyl pentadecanoate, ethyl tetradecanoate, propyl tridecanoate, butyl dodecanoate, pentyl undecanoate, hexyl decanoate, heptyl nonanoate, methyl cyclohexane carboxylate, ethyl cyclohexane carboxylate, propyl cyclohexane carboxylate, butyl cyclohexane carboxylate, pentyl cyclohexane carboxylate, hexyl cyclohexane carboxylate, heptyl cyclohexane carboxylate, octyl cyclohexane carboxylate, and nonyl cyclohexane carboxylate; unsaturated aliphatic acids such as octenoic acid, nonenoic acid, methyl nonenoate, decenoic acid, undecenoic acid, dodecenoic acid, tridecenoic acid, tetradecenoic acid, myristoleic acid, pentadecenoic acid, hexadecenoic acid, palmitoleic acid, and sapienic acid; and aromatic carboxylic acids such as terephthalic acid, pyromellitic acid, o-phenoxy benzoate, methyl benzoate, ethyl benzoate, propyl benzoate, butyl benzoate, pentyl benzoate, hexyl benzoate, heptyl benzoate, octyl benzoate, and nonyl benzoate. One kind of organic acid may be used singly or two or more kinds of organic acids may be used in combination. When such an organic acid and the second copper particles are combined together, there is a tendency that the dispersibility of the second copper particles and the desorption property of the organic acid during sintering can be both satisfied.

The amount of the surface treatment agent used for the treatment may be an amount large enough to form one molecular layer to three molecular layers on the surfaces of the second copper particles. The amount of the surface treatment agent used for the treatment may be 0.07% by mass or more, 0.10% by mass or more, or 0.2% by mass or more and may be 2.1% by mass or less, 1.6% by mass or less, or 1.1% by mass or less. The amount of the surface treatment agent used for the treatment of the second copper particles can be calculated by the method described above for the first copper particles. The specific surface area, the molecular weight of the surface treatment agent, and the minimum coating area of the surface treatment agent can also be calculated by the methods described above for the first copper particles.

As the second copper particles, it is possible to use commercially available products. Examples of commercially available second copper particles include CH-0200 (manufactured by Mitsui Mining & Smelting Co., Ltd., volume average particle diameter of 0.36 μm), HT-14 (manufactured by Mitsui Mining & Smelting Co., Ltd., volume average particle diameter of 0.41 μm), CT-500 (manufactured by Mitsui Mining & Smelting Co., Ltd., volume average particle diameter of 0.72 μm), and Tn-Cu100 (manufactured by Taiyo Nippon Sanso Corporation, volume average particle diameter of 0.12 μm).

The total of the content of the first copper particles and the content of the second copper particles in the copper paste may be 80% by mass or more based on the total mass of the metal particles contained in the copper paste. When the total of the content of the first copper particles and the content of the second copper particles is within the above-described range, breaking caused by thermal stress in a wiring to be obtained is less likely to occur. From the viewpoint of further exhibiting the above-described effects, the total of the content of the first copper particles and the content of the second copper particles may be 90% by mass or more, 95% by mass or more, or 100% by mass or more based on the total mass of the metal particles.

The copper paste may further contain different metal particles other than the copper particles. Examples of the different metal particles include the particles of nickel, silver, gold, palladium, platinum, and the like. The volume-average particle diameter of the different metal particles may be 0.01 μm or more or 0.05 μm or more and may be 10 μm or less, 5.0 μm or less, or 3.0 μm or less. In the case of containing the different metal particles, the content thereof may be less than 20% by mass or 10% by mass or less based on the total mass of the metal particles contained in the copper paste from the viewpoint of obtaining sufficient adhesiveness. The different metal particles may not be contained. The shape of the different metal particles is not particularly limited.

When the metal particles other than the copper particles are contained, since it is possible to obtain a wiring in which a plurality of kinds of metals is solidified or dispersed, the mechanical characteristics such as yield stress and fatigue strength of the wiring are improved, and the conduction reliability is likely to improve. In addition, when a plurality of kinds of metals is added, the bonding strength of a wiring to be obtained to a specific body to which the wiring is to be attached (for example, LCP) is likely to improve, and the conduction reliability is likely to improve.

The dispersion medium contained in the copper paste is not particularly limited and may be, for example, a volatile dispersion medium. Examples of the volatile dispersion medium include monovalent and polyvalent alcohols such as pentanol, hexanol, heptanol, octanol, decanol, ethylene glycol, diethylene glycol, propylene glycol, butylene glycol, α-terpineol, and isobornyl cyclohexanol; ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amides such as N-methyl-2-pyrrolidone, N,N-dimethylacetamide, and N,N-dimethylformamide; aliphatic hydrocarbons such as cyclohexane, octane, nonane, decane, and undecane; aromatic hydrocarbons such as benzene, toluene, and xylene; mercaptans having an alkyl group having 1 to 18 carbon atoms; and mercaptans having a cycloalkyl group having 5 to 7 carbon atoms. Examples of the mercaptans having an alkyl group having 1 to 18 carbon atoms include ethyl mercaptan, n-propyl mercaptan, i-propyl mercaptan, n-butyl mercaptan, i-butyl mercaptan, t-butyl mercaptan, pentyl mercaptan, hexyl mercaptan, and dodecyl mercaptan. Examples of the mercaptans having a cycloalkyl group having 5 to 7 carbon atoms include cyclopentyl mercaptan, cyclohexyl mercaptan, and cycloheptyl mercaptan.

The content of the dispersion medium may be 5 parts by mass or more and may be 50 parts by mass or less when the total mass of the metal particles contained in the copper paste is set to 100 parts by mass. When the content of the dispersion medium is within the above-described range, it is possible to adjust the viscosity to be appropriate with the copper paste, and the sintering of the copper particles is not easily impaired.

To the copper paste, if necessary, a wetting improver such as a nonionic surfactant or a fluorine-based surfactant; a defoamer such as silicone oil; an ion trapping agent such as an inorganic ion exchanger; or the like may be appropriately added.

The above-described copper paste can be prepared by mixing the copper particles and arbitrary components (an additive, the different metal particles, and the like) into the dispersion medium. After the mixing of the respective components, a stirring treatment may be performed. The maximum diameter of a dispersion liquid may be adjusted by a classification operation.

The copper paste may be prepared by mixing the second copper particles, the surface treatment agent, and the dispersion medium in advance and performing a dispersion treatment to prepare a dispersion liquid of the second copper particles and, furthermore, mixing the first copper particles, the different metal particles, and an arbitrary additive. When the copper paste is prepared in the above-described order, the dispersibility of the second copper particles improves, the mixing property with the first copper particles becomes favorable, and the performance of the copper paste further improves. An aggregate may be removed by performing a classification operation on the dispersion liquid of the second copper particles.

(Second Step)

As shown in (c) of FIG. 1, the copper particles are sintered, thereby forming copper wirings 3.

The copper particles can be sintered by a heating treatment. In the heating treatment, it is possible to use heating means, for example, a hot plate, a hot air dryer, a hot air heating furnace, a nitrogen dryer, an infrared ray dryer, an infrared ray heating furnace, a far-infrared ray heating furnace, a microwave heating device, a laser heating device, an electromagnetic heating device, a heater heating device, a steam heating furnace, or the like.

The atmosphere during sintering may be an oxygen-free atmosphere from the viewpoint of suppressing the oxidation of a sintered body or may be a reducing atmosphere from the viewpoint of removing a surface oxide of the copper particles in the copper paste layers 2. Examples of the oxygen-free atmosphere include an atmosphere into which an oxygen-free gas such as nitrogen or a rare gas is introduced or a vacuum. Examples of the reducing atmosphere include an atmosphere of a pure hydrogen gas, an atmosphere of a gas mixture of hydrogen and nitrogen represented by forming gas, an atmosphere of nitrogen containing a formic acid gas, an atmosphere of a gas mixture of hydrogen and a rare gas, an atmosphere of a rare gas containing a formic acid gas, and the like.

The peak temperature during the heating treatment may be 150° C. or higher and may be 350° C. or lower, 300° C. or lower, or 260° C. or lower from the viewpoint of the reduction of thermal damage to each member and the improvement of the yield. When the peak temperature is 150° C. or higher, there is a tendency that sintering sufficiently proceeds for a peak temperature retention time of 60 minutes or shorter. The peak temperature retention time may be one minute or longer and may be 60 minutes or shorter, 40 minutes or shorter, or 30 minutes or shorter from the viewpoint of fully volatilizing the dispersion medium and improving the yield.

The content (percentage volume) of copper in the copper wiring 3 is preferably 65% by volume or more, more preferably 70% by volume or more, and still more preferably 80% by volume or more based on the total volume of the copper wiring. When the content of copper in the copper wiring 3 is set to 65% by volume or more, favorable conduction reliability can be obtained. The content (percentage volume) of copper in the copper wiring 3 is preferably 95% by volume or less based on the total volume of the copper wiring. In this case, the copper wiring 3 may have pores. When the copper wiring 3 appropriately has pores, in the case of applying a solder paste containing a resin component to a surface of the copper wiring 3 opposite to the surface in contact with the polymer compact 1, the resin component is easily loaded into the pores inside the copper wiring 3, and the resin also reaches pore parts 3a of the copper wiring 3 in contact with the polymer compact and cures in the pore parts 3a, whereby it is possible to further improve the bonding strength between the polymer compact 1 and the copper wiring 3.

In a case where the composition of a material that forms the copper wiring 3 is known, it is possible to obtain the content of copper in the copper wiring 3, for example, in the following order. First, the copper wiring 3 is cut out into a cuboid, the vertical and horizontal lengths of the copper wiring 3 are measured with a caliper or an outer shape measuring instrument, and the thickness is measured with a film thickness meter, thereby calculating the volume of the copper wiring 3. The apparent density $M_1$ (g/cm$^3$) is obtained from the volume of the cut-out copper wiring 3 and the weight of the copper wiring 3 measured with a precise scale. The content (% by volume) of copper in the copper wiring 3 is obtained from the following equation (A) using the obtained $M_1$ and the density of copper (8.96 g/cm$^3$).

Content (% by volume) of copper in copper wiring 3=[($M_1$)/8.96]×100(A)

In the copper wiring 3, the percentage of the copper element in elements excluding light elements among the elements that configure the copper wiring 3 may be 95% by mass or more, may be 97% by mass or more, may be 98% by mass or more, or may be 100% by mass. When the percentage of the copper element in the copper wiring 3 is within the above-described range, it is possible to suppress the formation of an intermetallic compound or the precipitation of a heterogeneous element in a grain boundary between metallic copper grains, the properties of metallic copper that forms the copper wiring 3 are likely to become strong, and superior connection reliability is easily obtained. In addition, in a case where the percentage of the copper element in the elements excluding light elements in the copper wiring 3 is 100% by mass, the percentage volume of the copper can be regarded as the degree of denseness (%).

The copper wiring 3 preferably includes a structure derived from the first copper particles oriented substantially parallel to the bonding interface with the polymer compact 1 (for example, the bonding surface between the polymer compact 1 and the copper wiring 3). In this case, due to the first copper particles oriented substantially parallel to the polymer compact 1, it is possible to suppress the breakage of the copper wiring 3 formed by sintering. Furthermore, while the reason therefor is not clear, it is possible to improve the adhesiveness between the copper wiring 3 formed by sintering and the polymer compact 1.

(Third Step)

Subsequent to the second step, a solder paste containing solder particles 4 and a resin component 5 is applied onto the copper wirings 3 in a prescribed pattern to form a solder paste layer 6 as shown in (d) of FIG. 1. A part of the resin component 5 permeates the pore parts 3a in the copper wirings 3 and thereby forms resin-loaded parts 7, which are loaded with the resin component 5, in at least a portion of the copper wirings 3.

The particle diameters of the solder particles 4 may be, for example, 0.4 to 30 μm, 0.5 to 20 μm, or 0.6 to 15 μm. When the particle diameters of the solder particles 4 are 0.4 μm or more, the solder particles 4 are not easily affected by the oxidation of the solder surface, and the conduction reliability is likely to improve. On the other hand, when the particle diameters of the solder particles 4 are 30 μm or less, the insulation reliability is likely to improve.

The particle diameters of the solder particles 4 can be measured by observation using a scanning electron microscope (SEM). That is, the average particle diameter of the solder particles can be obtained by measuring the particle diameters by the observation of 300 arbitrary solder particles using a SEM and producing the average value thereof.

The solder particles 4 contain tin. As the solder particles 4, at least one tin alloy selected from the group consisting of an In—Sn alloy, an In—Sn—Ag alloy, a Sn—Bi alloy, a Sn—Bi—Ag alloy, a Sn—Ag—Cu alloy, and a Sn—Cu alloy may be used. Examples of the tin alloy include In—Sn (In: 52% by mass, Sn: 48% by mass, melting point: 118° C.), In—Sn—Ag (In: 20% by mass, Sn: 77.2% by mass, Ag: 2.8% by mass, melting point: 175° C.), Sn—Bi (Sn: 43% by mass, Bi: 57% by mass, melting point: 138° C.), Sn—Bi—Ag (Sn: 42% by mass, Bi: 57% by mass, Ag: 1% by mass, melting point: 139° C.), Sn—Ag—Cu (Sn: 96.5% by mass, Ag: 3% by mass, Cu: 0.5% by mass, melting point: 217° C.), and Sn—Cu (Sn: 99.3% by mass, Cu: 0.7% by mass, melting point: 227° C.).

The tin alloy can be selected depending on the bonding temperature. For example, in the case of using a tin alloy having a lower melting point such as the In—Sn alloy, the Sn—Bi alloy, or the like, it is possible to bond the copper wiring 3 and the polymer compact 1 at 150° C. or lower. In the case of using a tin alloy having a higher melting point such as Sn—Ag—Cu or Sn—Cu, there is a tendency that high reliability can be attained even after the tin alloy is left to stand at high temperatures.

The tin alloy that forms the solder particles 4 may contain at least one element selected from Ag, Cu, Ni, Bi, Zn, Pd, Pb, Au, P, and B. Among these elements, the tin alloy may contain Ag or Cu from the following viewpoint. That is, when the solder particles 4 contain Ag or Cu, it is possible to decrease the melting point of the solder particles to approximately 220° C., and the bonding strength with electrodes improves, whereby an effect of obtaining favorable conduction reliability is exhibited.

The Cu content rate of the solder particles 4 may be, for example, 0.05% to 10% by mass, 0.1% to 5% by mass, or 0.2% to 3% by mass. When the Cu content rate is 0.05% by mass or more, favorable solder connection reliability is easily obtained, and, when the Cu content rate is 10% by mass or less, the melting point of the solder particles becomes low, the solder wettability improves, and consequently, the connection reliability of the bonding part easily becomes favorable.

The Ag content rate of the solder particles 4 may be, for example, 0.05% to 10% by mass, 0.1% to 5% by mass, or 0.2% to 3% by mass. When the Ag content rate is 0.05% by mass or more, favorable solder connection reliability is easily obtained, and, on the other hand, when the Ag content rate is 10% by mass or less, the melting point becomes low, the solder wettability improves, and consequently, the connection reliability of the bonding part easily becomes favorable.

The resin component 5 may contain a thermosetting compound. Examples of the thermosetting compound include an oxetane compound, an epoxy compound, an episulfide compound, a (meth)acrylic compound, a phenolic compound, an amino compound, an unsaturated polyester compound, a polyurethane compound, a silicone compound, and a polyimide compound. Among these, the epoxy compound is preferred from the viewpoint of making the curing property and viscosity of the resin component more favorable and further enhancing the adhesiveness between the polymer compact 1 and the copper wirings 3.

The resin component 5 may contain a thermal curing agent. Examples of the thermal curing agent include an imidazole curing agent, an amine curing agent, a phenolic curing agent, a polythiol curing agent, an acid anhydride, a thermal cation initiator, and a thermal radical generating agent. One kind of thermal curing agent may be used singly or two or more kinds of thermal curing agents may be jointly used. The imidazole curing agent, the polythiol curing agent, or the amine curing agent is preferred since it is possible to rapidly cure the resin component 5 at low temperatures. In addition, from the viewpoint of enhancing the storage stability at the time of mixing the thermosetting compound and the thermal curing agent, a latent thermal curing agent may be used as the thermal curing agent. The latent thermal curing agent is preferably a latent imidazole curing agent, a latent polythiol curing agent, or a latent amine curing agent. The thermal curing agent may be covered with a polymer substance such as a polyurethane resin or a polyester resin.

Examples of the imidazole curing agent include 2-methylimidazole, 2-ethyl-4-methylimidazole, 1-cyanoethyl-2-phenylimidazole, 1-cyanoethyl-2-phenylimidazolium trimellitate, 2,4-diamino-6-[2'-methylimidazolyl-(1')]-ethyl-s-triazine, and 2,4-diamino-6-[2'-methylimidazolyl-(1')]-ethyl-s-triazine isocyanuric acid adduct.

Examples of the polythiol curing agent include trimethylolpropane tris-3-mercaptopropionate, pentaerythritol tetrakis-3-mercaptopropionate, and dipentaerythritol hexa-3-mercaptopropionate. The solubility parameter of the polythiol curing agent is preferably 9.5 or more and preferably 12 or less. The solubility parameter is calculated by the Fedors method. For example, the solubility parameter of trimethylolpropane-3-mercaptopropionate is 9.6, and the solubility parameter of dipentaerythritol hexa-3-mercaptopropionate is 11.4.

Examples of the amine curing agent include hexamethylenediamine, octamethylenediamine, decamethylenediamine, 3,9-bis(3-aminopropyl)-2,4,8,10-tetraspiro [5.5]undecane, bis(4-aminocyclohexyl)methane, meta phenylene diamine, and diaminodiphenyl sulfone.

Examples of the thermal cation curing agent include an iodonium-based cation curing agent, an oxonium-based cation curing agent, and a sulfonium-based cation curing agent. Examples of the iodonium-based cation curing agent include bis(4-tert-butylphenyl)iodonium hexafluorophosphate. Examples of the oxonium-based cation curing agent include trimethyloxonium tetrafluoroborate. Examples of the sulfonium-based cation curing agent include tri-p-tolylsulfonium hexafluorophosphate.

Examples of the thermal radical generating agent include an azo compound and an organic peroxide. Examples of the azo compound include azobisisobutyronitrile (AIBN). Examples of the organic peroxide include di-tert-butyl peroxide and methyl ethyl ketone peroxide.

The resin component 5 may further contain a flux. The flux melts an oxide on the solder surface to fuse the particles and to improve the solder wettability to the copper wirings 3.

As the flux, it is possible to use a flux that is ordinarily used for solder bonding or the like. Examples of the flux include zinc chloride, a mixture of zinc chloride and an inorganic halide, a mixture of zinc chloride and an inorganic acid, a molten salt, phosphoric acid, a derivative of phosphoric acid, an organic halide, hydrazine, an organic acid, and a pine rosin. One kind of flux may be used singly or two or more kinds of fluxes may be jointly used.

Examples of the molten salt include ammonium chloride. Examples of the organic acid include lactic acid, citric acid, stearic acid, glutamic acid, and glutaric acid. Examples of the pine rosin include an activated pine rosin and a deactivated pine rosin. The rosin refers to rosins containing abietic acid as a main component. When an organic acid or pine rosin having two or more carboxyl groups is used as the flux, an effect of further enhancing conduction reliability between electrodes is exhibited.

The melting point of the flux is preferably 50° C. or higher, more preferably 70° C. or higher, and still more preferably 80° C. or higher. The melting point of the flux is preferably 200° C. or lower, more preferably 160° C. or lower, still more preferably 150° C. or lower, and particularly preferably 140° C. or lower. When the melting point of the flux is within the above-described range, the flux effect is more effectively exhibited, and the solder particles are more efficiently disposed on electrodes. The range of the melting point of the flux is preferably 80° C. to 190° C. and more preferably 80° C. to 140° C.

Examples of the flux having a melting point in the range of 80° C. to 190° C. include dicarboxylic acids such as succinic acid (melting point: 186° C.), glutaric acid (melting point: 96° C.), adipic acid (melting point: 152° C.), pimelic acid (melting point: 104° C.), and suberic acid (melting point: 142° C.), benzoic acid (melting point: 122° C.), and malic acid (melting point: 130° C.).

(Fourth Step)

Subsequent to the third step, an electronic element 8 having electrodes 9 is disposed (mounted) at a prescribed position on the solder paste layer 6 as shown in (e) of FIG. 1 (fourth step). Examples of the electronic element 8 include a power module made up of a diode, a rectifier, a thyristor, a MOS gate driver, a power switch, a power MOSFET, IGBT, a Schottky diode, and a fast recovery diode, a transmitter, an amplifier, an LED module, a capacitor, a gyroscope sensor, and the like.

Examples of the method for disposing the electronic element 8 on the solder paste layer 6 include a method in which a chip mounter, a flip-chip bonder, a carbon or ceramic positioning jig, or the like is used.

The electrode 9 may be an electrode containing at least one metal selected from the group consisting of copper, nickel, palladium, gold, platinum, silver, and tin in the outermost surface and is preferably an electrode containing at least one metal from the group consisting of copper, nickel, and palladium in the outermost surface since no impurity (intermetallic compound) is formed between a solder layer 11 and the electrode 9 even when the electrode is bonded to the solder layer 11 and then left to stand at high temperatures and it is possible to mount the electrode with high bonding reliability. The electrode 9 may be formed of a single layer containing these metals or a plurality of metal-containing layers.

(Fifth Step)

Subsequent to the fourth step, the solder particles 4 are melted, whereby the solder layers 11 are formed, and the copper wirings 3 and the electrodes 9 in the electronic element 8 are bonded to each other as shown in (f) of FIG. 1 (fifth step). As a result, an electronic component 10 is obtained.

As a method for melting the solder particles 4, it is possible to perform a heating treatment. In the heating treatment, it is possible to use heating means, for example, a hot plate, a hot air dryer, a hot air heating furnace, a nitrogen dryer, an infrared ray dryer, an infrared ray heating furnace, a far-infrared ray heating furnace, a microwave heating device, a laser heating device, an electromagnetic heating device, a heater heating device, a steam heating furnace, or the like.

The solder particles 4 are melted to form the solder layers 11, the copper wirings 3 and the electrodes 9 in the electronic element 8 are bonded to each other, and the resin component 5 cures, thereby forming resin layers 12 covering at least a portion of the solder layers 11. As a specific example, it is preferable that, Sn—Bi (Sn: 43% by mass, Bi: 57% by mass) having a melting point of 138° C. is held at 150° C. to form the solder layers 11, and the resin component 5 covers the outer circumferential parts of the solder layers 11 and cures, thereby forming the resin layers 12. In addition, at this time, the resin component that has been loaded into at least a portion of the pore parts 3a in the copper wirings 3 cures, whereby resin-loaded parts 13 are formed.

The atmosphere during solder bonding may be an oxygen-free atmosphere from the viewpoint of suppressing the oxidation of a sintered body or may be a reducing atmosphere from the viewpoint of removing a surface oxide of the copper wirings 3. Examples of the oxygen-free atmosphere include an atmosphere into which an oxygen-free gas such as nitrogen or a rare gas is introduced or a vacuum. Examples of the reducing atmosphere include an atmosphere of a pure hydrogen gas, an atmosphere of a gas mixture of hydrogen and nitrogen represented by forming gas, an atmosphere of nitrogen containing a formic acid gas, an atmosphere of a gas mixture of hydrogen and a rare gas, an atmosphere of a rare gas containing a formic acid gas, and the like.

The peak temperature during the heating treatment may be 150° C. or higher and may be 350° C. or lower, 300° C. or lower, or 260° C. or lower from the viewpoint of the reduction of thermal damage to each member and the improvement of the yield. When the peak temperature is 150° C. or higher, there is a tendency that the melting of the solder particles 4 sufficiently proceeds for a peak temperature retention time of 60 minutes or shorter.

The solder bonding may be performed with a pressure applied to the electronic element 8 or may be performed by the weights of the electronic element 8 and other members on the solder paste layer 6. The pressure may be 0.01 MPa or less or 0.005 MPa or less. When a pressure that the electronic element 8 receives during sintering is within the above-described range, since there is no need for a special pressurization device, it is possible to reduce voids and to further improve the bonding strength and the connection reliability without impairing the yield. Examples of the method for applying the pressure to the electronic element 8 include a method in which a weight is placed on the electronic element 8 positioned uppermost.

The electronic component 10 obtained by the above-described manufacturing method includes the polymer compact 1, the copper wirings 3 provided on the polymer compact 1, the solder layers 11 bonding the copper wirings 3 and the electronic element 8, and the resin layers 12 covering at least a portion of the solder layers 11. At least a portion of the pore parts 3a in the copper wirings 3 are loaded with a cured product of the same resin component as the resin layer 12.

Figure 2:
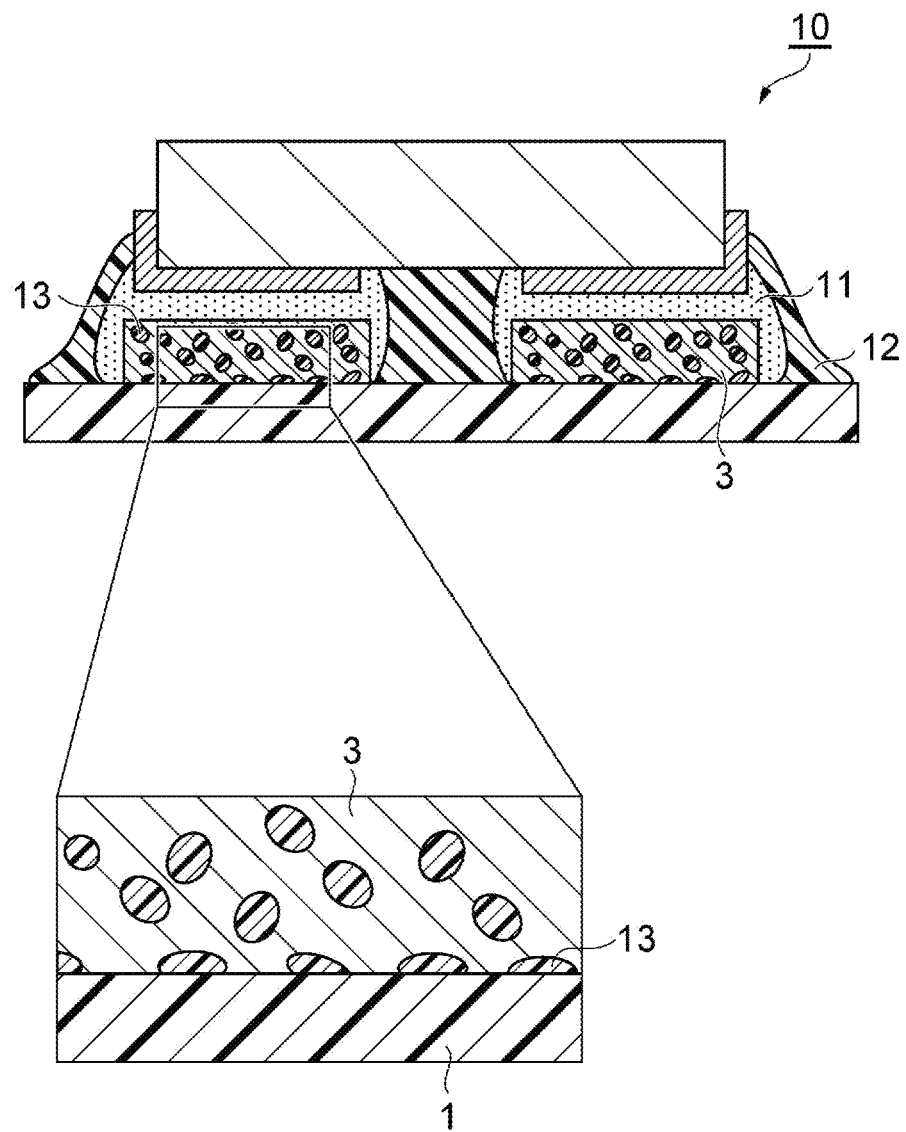
FIG. 2 is a schematic cross-sectional view for describing a bonding part between a metal wiring and a polymer compact in the electronic component.

FIG. 2 is a view showing a detail of the bonding part between the copper wiring 3 and the polymer compact 1 in the electronic component 10. The pore parts 3a in the copper wiring 3 are formed in the interface with the polymer compact 1, and the resin component is loaded into the pore parts 3a and cures to form the resin-loaded parts 13, whereby it is possible to improve the adhesiveness between the copper wiring 3 and the polymer compact 1.

Figure 3:
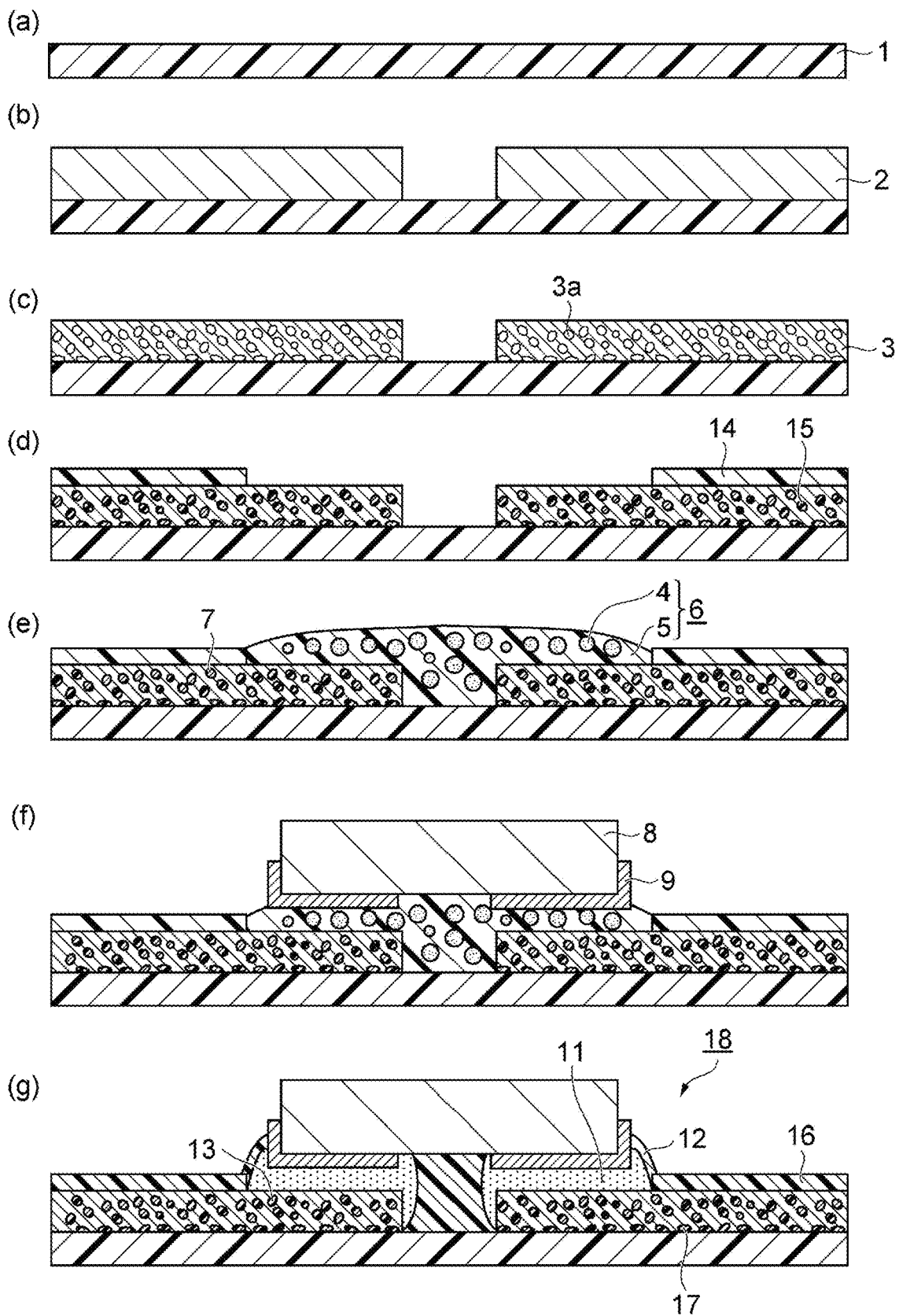
FIG. 3 is schematic cross-sectional views showing a method for manufacturing an electronic component of an embodiment.

FIG. 3 is schematic cross-sectional views showing a method for manufacturing an electronic component of another embodiment. Hereinafter, the present embodiment will be described, but the same description as in the above-described embodiment will not be made. In this manufacturing method, in the preparation step in the first step, the polymer compact 1 is prepared as shown in (a) of FIG. 3 (preparation step). In the first step, subsequent to the preparation step, as shown in (b) of FIG. 3, the copper paste is applied onto the polymer compact 1 in a prescribed pattern (onto in the part at which a copper wiring is to be formed) to form the copper paste layers 2 (formation step). In addition, as shown in (c) of FIG. 3, the copper particles are sintered to each other, thereby forming the copper wirings 3 (Second step).

Subsequently, resin layers 14 containing a resin component are formed in a portion of the copper wirings 3 as shown in (d) of FIG. 3. The resin component is loaded into at least a portion of the pore parts 3a in the copper wirings 3, whereby resin-loaded parts 15 are obtained. The resin component may be the same as the resin component 5 in the above-described solder paste. In a case where the resin component is the same as the resin component 5, the resin layers 14 may be applied to the entire surfaces of the copper wirings 3 and the polymer compact 1. The solder paste containing the solder particles 4 and the resin component 5 may be applied to the upper parts of the resin layers 14 applied onto the copper wirings 3. In places other than the copper wirings 3 to which the electronic element 8 is to be bonded, the resin layers 14 are formed and may or may not be cured in advance. The atmosphere during the curing of the resin layers 14 may be an oxygen-free atmosphere or may be a reducing atmosphere from the viewpoint of suppressing the oxidation of the copper wirings 3. Examples of the oxygen-free atmosphere include an atmosphere into which an oxygen-free gas such as nitrogen or a rare gas is introduced or a vacuum. Examples of the reducing atmosphere include an atmosphere of a pure hydrogen gas, an atmosphere of a gas mixture of hydrogen and nitrogen represented by forming gas, an atmosphere of nitrogen containing a formic acid gas, an atmosphere of a gas mixture of hydrogen and a rare gas, an atmosphere of a rare gas containing a formic acid gas, and the like.

Subsequently, the solder paste is applied onto prescribed copper wirings 3 in a prescribed pattern as shown in (e) of FIG. 3 (third step). The resin component 5 permeates the pore parts 3a in the copper wirings 3 and is loaded into at least a portion of the copper wirings 3. Subsequent to the third step, the electronic element 8 having the electrodes 9 is disposed (mounted) at a prescribed position on the solder paste layer 6 as shown in (f) of FIG. 3 (fourth step). Subsequent to the fourth step, the solder particles 4 are melted, whereby the solder layers 11 are formed, and the copper wirings 3 and the electrodes 9 in the electronic element 8 are bonded to each other as shown in (g) of FIG. 3 (fifth step). In addition, the resin layers 14 cure to become resin layers 16. As a result, an electronic component 18 is obtained.

The electronic component 18 obtained by the above-described manufacturing method includes the polymer compact 1, the copper wirings 3 provided on the polymer compact 1, the solder layers 11 bonding the copper wirings 3 and the electrodes 9 in the electronic element 8, the resin layers 12 covering at least a portion of the solder layers 11, and the resin layers 16 covering at least a portion of the copper wirings 3. At least a portion of the pore parts 3a in the copper wirings 3 are loaded with a cured product of the same resin component as the resin layer 12 or the resin layer 16.

In the method for manufacturing an electronic component according to the present embodiment, since the copper paste is applied in a prescribed pattern (a pattern corresponding to the copper wirings 3), a polymer containing a catalyst is not necessary, and it is possible to skip laser radiation and the electroless copper plating step. Additionally, in these manufacturing methods, the paste layer 6 is formed on the copper wirings 3, and then the electronic element 8 is disposed and thermally treated, thereby bonding the copper wirings 3 and the electronic element 8 to each other by soldering. In addition, at least a portion of the solder layers 11 are covered with the resin layers 12, and the resin component loaded into at least a portion of the pore parts in the copper wirings 3 cures to form the resin-loaded parts 13 or the resin-loaded parts 17, whereby it is possible to improve the adhesiveness between the polymer compact and the copper wirings.

In the manufacturing method according to the present embodiment, since the resin layers 14 containing the resin component that covers a portion of the copper wirings 3 and the resin component 5 in the solder paste are made of the same component, it is possible to perform the solder bonding between the electronic element 8 and the copper wirings 3 and the production of surface protection coatings on the copper wirings 3 with the same step, and, compared with steps that were performed in the related art (a solder resist formation step (the formation of an opening part for solder bonding by the application, exposure, and development of an organic coating on a copper wiring and the front surface of a polymer compact), the application of a solder paste to a wiring opening part, a solder bonding step by a thermal treatment (component mounting), and the like), it is possible to significantly shorten the time for the steps and the manufacturing.

Figure 4:
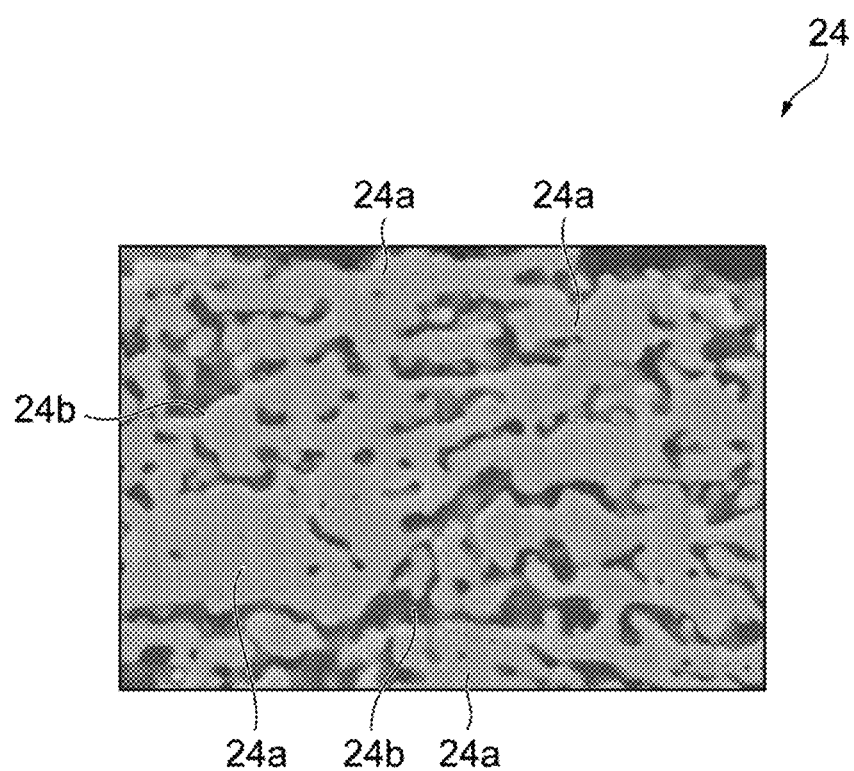
FIG. 4 is a SEM image showing an example of a cross section of the metal wiring made of a sintered body of metal particles.

FIG. 4 is a SEM image showing an example of a cross section of a metal wiring made of a sintered body of copper particles. A copper wiring 24 shown in FIG. 4 is a structure derived from flake-shaped copper particles oriented substantially parallel to a bonding interface (for example, a bonding surface between a polymer compact and a wiring). In a case where a wiring has the copper wiring 24, it is possible to suppress the breakage of the wiring by orienting flake-shaped copper particles substantially parallel to the bonding interface direction. Furthermore, while the reason therefor is not clear, it is possible to improve the adhesiveness between the wiring and the polymer compact.

The wiring having the copper wiring 24 shown in FIG. 4 may further include, in addition to sintered copper 24a derived from the flaked-shaped copper particles, holes 24b and sintered copper derived from copper particles bonding the flake-shaped copper particles to each other (for example, spherical copper particles). The wiring having the copper wiring 24 can be formed by sintering, for example, a copper paste containing flake-shaped copper particles and, depending on the situation, copper particles bonding the flake-shaped copper particles to each other (for example, spherical copper particles).

Here, the flake shape includes a flat plate shape such as a plate shape or a scale shape. In the sintered copper 24a derived from the flaked-shaped copper particles included in the above-described structure, the ratio of the long diameter (maximum diameter) to the thickness (long diameter/thickness, aspect ratio) may be five or more. The number-average particle diameter of the long diameters may be 2.0 μm or more, may be 3.0 μm or more, and may be 4.0 μm or more. In a case where the sintered copper 24a derived from the flaked-shaped copper particles has such a shape, a reinforcement effect of the copper wiring 24 included in the wiring improves, and the adhesiveness (bonding strength) between the wiring and the polymer compact and the conduction reliability of the wiring become superior.

The long diameter and thickness of the sintered copper 24a derived from the flaked-shaped copper particles can be obtained from, for example, a SEM image of a cross-section of the wiring. Hereinafter, a method for measuring the long diameter and thickness of the sintered copper derived from the flaked-shaped copper particles from a SEM image will be exemplified. First, the wiring is cut out into a cubic shape to produce a sample for measurement. The sample is disposed in a cup for casting, and an epoxy cast resin is poured into the cup so as to bury the entire sample and is cured. The cast sample is cut in the vicinity of a cross section that is desired to observe, and the cross section is trimmed by polishing and processed with a cross section polisher (CP). The cross section of the sample is observed with a SEM at a magnification of 5000 times. A cross-sectional image (for example, 5000 times) of the wiring is acquired, in a linear, cuboid-shaped, or ellipsoid-shaped portion in a dense continuous portion, a straight line having the maximum length among straight lines included in the portion is regarded as the long diameter, a straight line having the maximum length among straight lines that are orthogonal to the above-described straight line and are included in the portion is regarded as the thickness, a copper particle having a length of the long diameter of 1.0 μm or more and a ratio of the long diameter to the thickness of four or more is regarded as the sintered copper derived from the flake-shaped copper particle, and the long diameter and thickness of the sintered copper derived from the flake-shaped copper particle are measured with image processing software having a length measurement function. The average value thereof can be obtained by calculating the number average from 20 randomly selected portions.

In the above-described embodiments, an aspect in which copper particles are used as the metal particles has been described, but the metal particles according to the present embodiment are not limited to copper particles. It is possible to use particles containing sinterable metal. Even in the case of using metal particles other than copper particles, it is possible to apply the above-described steps for manufacturing the electronic component.

EXAMPLES

Hereinafter, the present invention will be more specifically described using examples. However, the present invention is not limited to the following examples.

[Preparation of Copper Pastes]

(Copper Paste a1)

As dispersion media, α-terpionel (manufactured by FUJI-FILM Wako Pure Chemical Corporation) (5.2 g) and isobornyl cyclohexanole (manufactured by Nippon Terpene Chemicals, Inc.) (6.8 g) and, as sub-micro copper particles, "CH-0200" (manufactured by Mitsui Mining & Smelting Co., Ltd., 50% volume-average particle diameter: 0.36 µm, content of copper particles having particle diameter of 0.01 to 0.8 µm: 95% by mass) (52.8 g) were mixed in a plastic bottle and treated with an ultrasonic homogenizer (trade name "US-600" manufactured by Nippon Seiki Co., Ltd.) at 19.6 kHz and 600 W for one minute, thereby obtaining a dispersion liquid. As flake-shaped micro copper particles, "MA-C025" (manufactured by Mitsui Mining & Smelting Co., Ltd., content of copper particles having maximum diameter of 1 to 20 µm: 100% by mass) (35.2 g) was added to this dispersion liquid and agitated with a spatula until dried powder disappeared. The plastic bottle was airtightly stoppered, and the components were stirred for two minutes with a rotation and revolution-type stirring device (trade name "Planetry Vacuum Mixer ARV-310" manufactured by THINKY Corporation) and stirred under reduced pressure at 2000 rpm for two minutes, thereby obtaining a copper paste a1.

(Copper Paste a2)

A copper paste a2 was obtained in the same manner as in the preparation of the copper paste a1 except that, instead of the sub-micro copper particles, silver-coated copper particles "10% Ag coated Cu-HWQ 5 µm" (manufactured by Fukuda Metal Foil & Powder Co., Ltd., 50% volume-average particle diameter: 5.89 µm) were used, and, instead of the flake-shaped micro copper particles, silver-coated copper particles "10% Ag coated 2L3" (manufactured by Fukuda Metal Foil & Powder Co., Ltd., 50% volume-average particle diameter: 10.86 µm) were used.

[Preparation of Solder Paste]

Solder particles ("Sn42-Bi58" particles, average particle diameter: 20 µm) (70 parts by mass), a bisphenol F-type epoxy resin (trade name "YDF-170" manufactured by Nippon Steel & Sumikin Chemical Co., Ltd., epoxy equivalent: 170) (25.2 parts by mass), an imidazole compound (trade name "2PZ-CN" manufactured by Shikoku Chemicals Corporation) (1.3 parts by mass), and 2,2-bishydroxymethyl-propionic acid (3.5 parts by mass) were mixed together, thereby preparing a solder paste.

Example 1

(Production of Electronic Component 40)

A polymer compact made of a liquid crystal polymer having sizes of 40 mm×40 mm and a thickness of 3 mm (trade name "SUMIKASUPER E6000HF" manufactured by Sumitomo Chemical Co., Ltd.) was prepared. Subsequently, a stainless steel metal mask (thickness: 50 µm) having two 1.5 mm×1 mm rectangular openings was placed on the polymer compact 31 as shown in (a) of FIG. 5, and the copper paste a1 was applied by stencil printing in which a metal squeegee was used, thereby obtaining a member on which copper paste layers 32 were formed.

The member was set in a tube furnace (manufactured by AVC Co., Ltd.), and an argon gas was caused to flow at 1 L/minute to substitute the air with the argon gas. After that, the copper paste layers 32 were sintered by performing a sintering treatment under conditions in which the temperature was raised for 10 minutes and held at 180° C. for 60 minutes under the flow of a hydrogen gas at 300 mL/minute, thereby forming copper wirings 33 as shown in (b) of FIG. 5.

Figure 5:
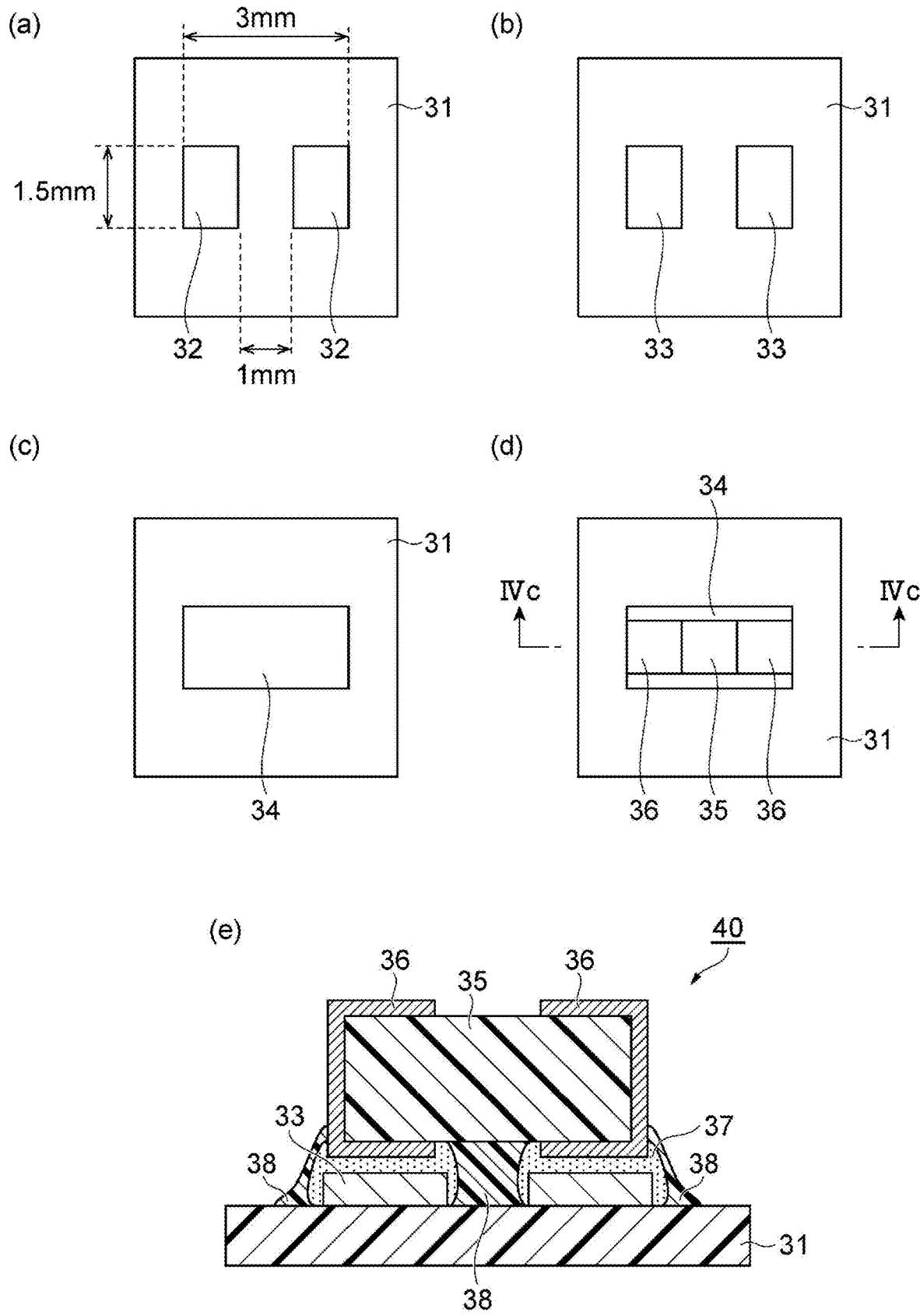
FIG. 5 is schematic views showing a method for manufacturing an electronic component in an example.

Subsequently, the solder paste was applied onto the copper wirings 33 to form a solder paste layer 34 as shown in (c) of FIG. 5, and then, as shown in (b) of FIG. 5, a member in which a ceramic capacitor 35 (2 mm×1.2 mm×0.6 mmt, trade name "GQM series" manufactured by Murata Manufacturing Co., Ltd.) having electrodes 36 formed thereon was disposed (mounted) on the solder paste layer 34 was obtained. The electrodes 36 were formed of copper at both ends of the ceramic capacitor 35.

Subsequently, the member shown in (d) of FIG. 5 was placed on a hot plate that had been heated to 170° C. in the atmosphere for 15 minutes, thereby obtaining an electronic component 40. The cross-sectional shape of the electronic component 40 is shown in (e) of FIG. 5. (e) of FIG. 5 is a cross-sectional view taken along the line IVc-IVc in (d) of FIG. 5. The electrodes 36 in the ceramic capacitor 35 and the copper wirings 33 were bonded to each other with solder layers 37, and the outer circumferences of solder bonding parts were reinforced with resin layers 38.

Figure 6:
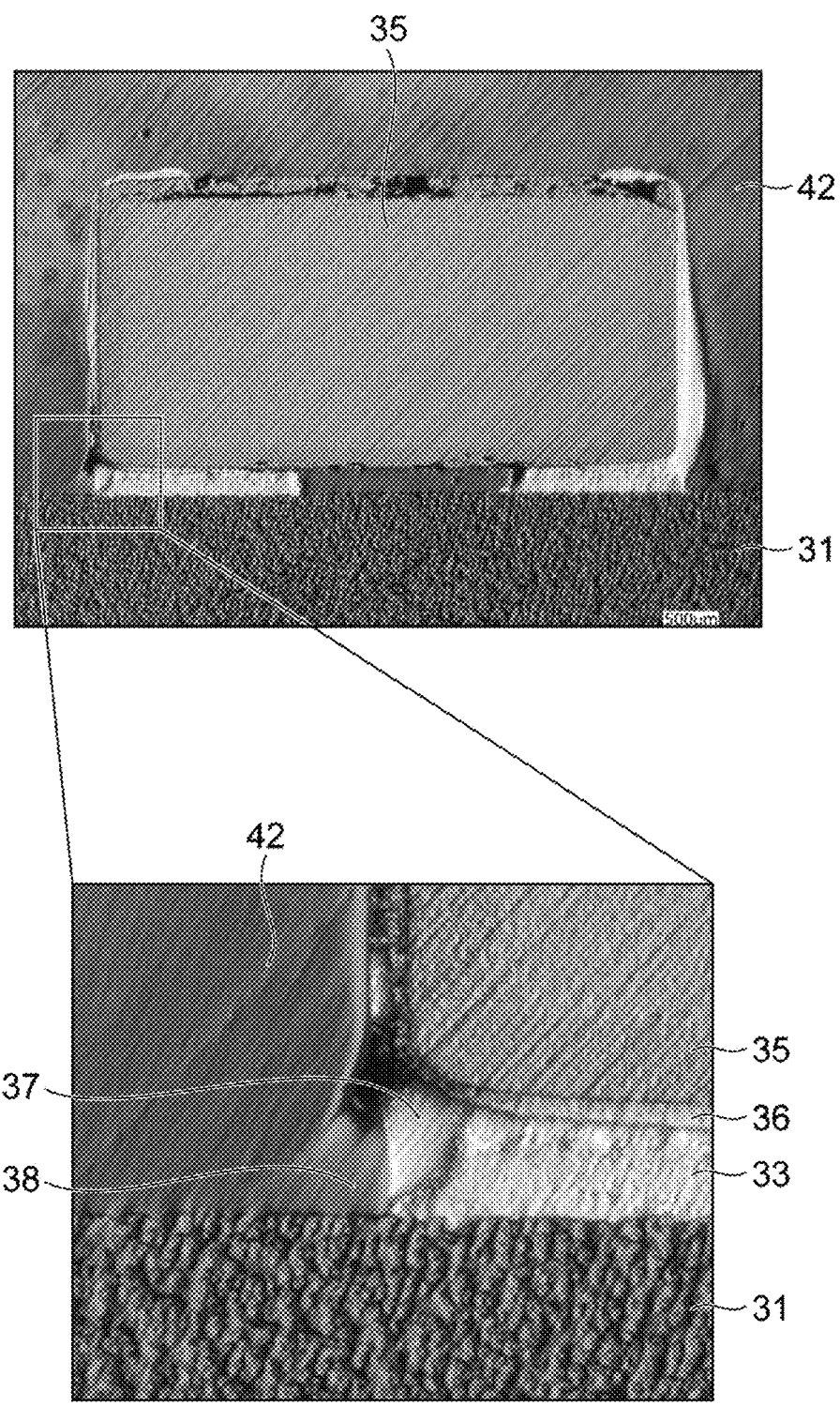
FIG. 6 is cross-sectional observation views of the electronic component produced in the example.
Figure 7:
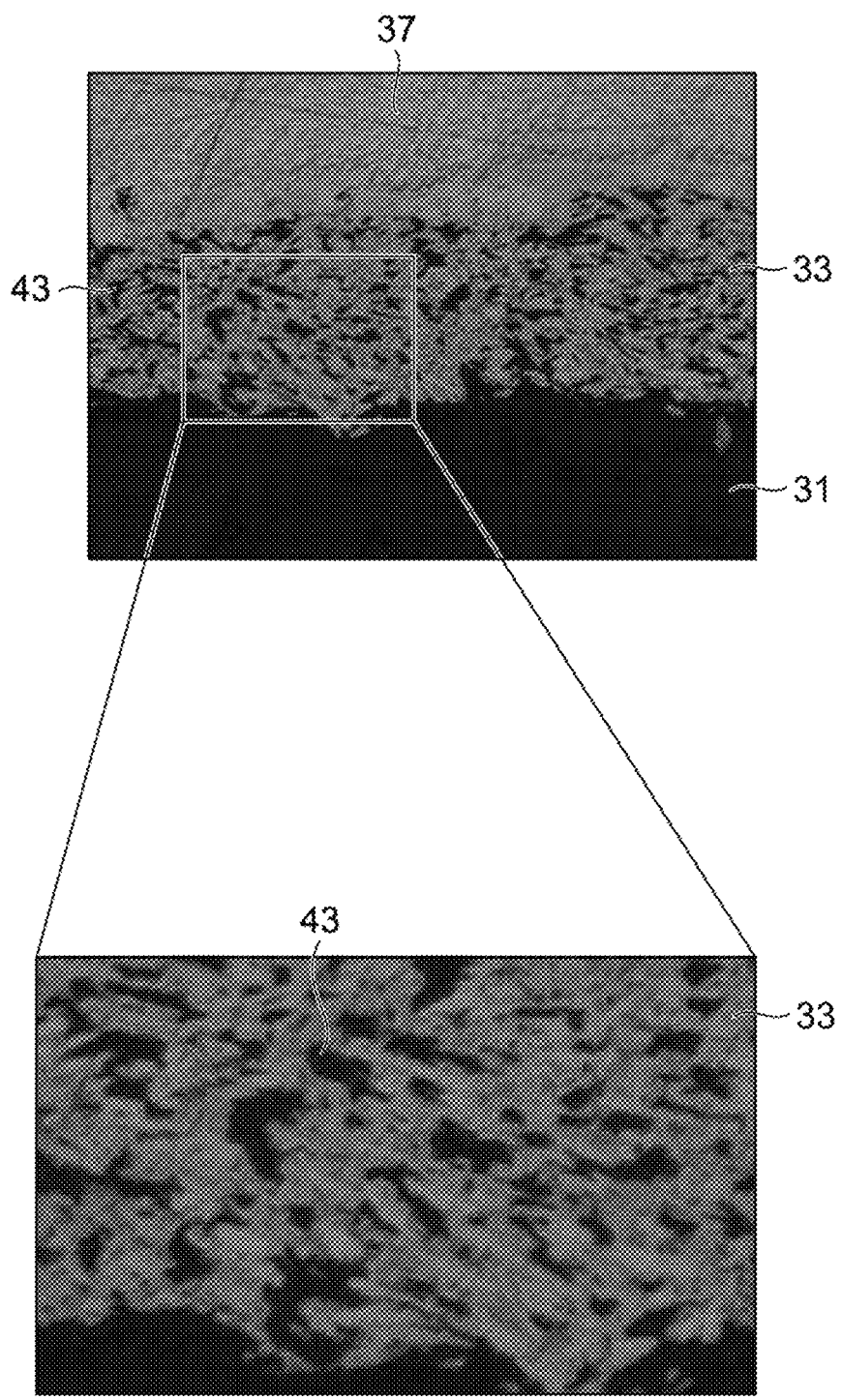
FIG. 7 is cross-sectional observation views of the electronic component produced in the example.

The electronic component 40 was buried in a cast resin 42 to produce a sample for cross section observation. The observation result of the cross section of the electronic component 40 with an optical microscope is shown in FIG. 6. The electrode 36 in the ceramic capacitor 35 and the copper wiring 33 were bonded to each other through the solder layer 37, and the resin layer 38 was formed at the outer circumferences of the solder layer 37. The observation result of the cross section of the polymer compact 31, the copper wiring 33, and the solder layer 37 with an optical microscope is shown in FIG. 7. The copper wiring 33 has pores, a resin component was loaded into pore parts, and resin-loaded parts 43 were formed.

(Evaluation of Adhesiveness)

Figure 10:
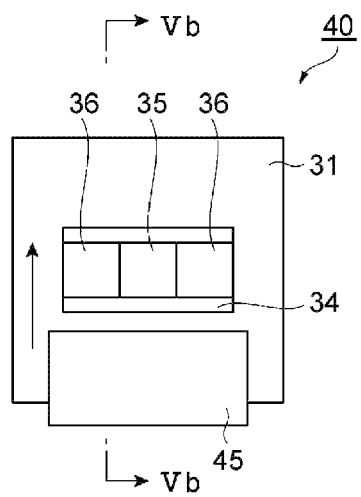
FIG. 10 is schematic views for describing a method for measuring a shear strength in the example.
Figure 10:
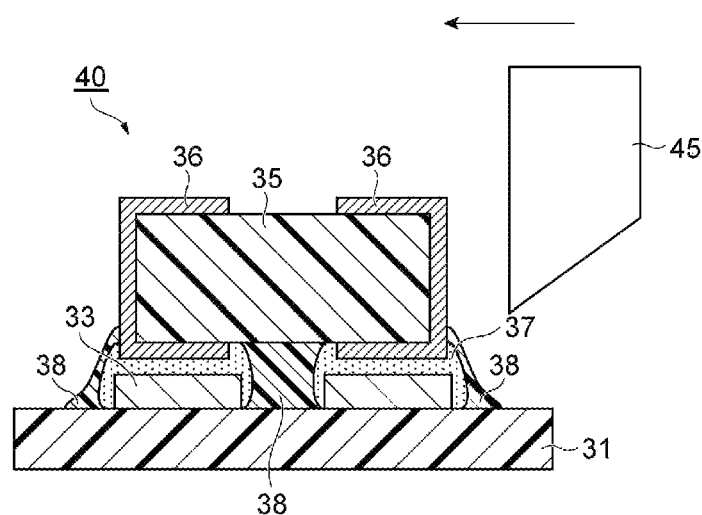

For the electronic component 40, the connection strength (shear strength) was measured using a bond tester (trade name: multipurpose bond tester series 4000 manufactured by Nordson DAGE). Specifically, a shear tool 45 was disposed at a shear height of 50 µm over the electronic component 40 as shown in (a) of FIG. 10 and (b) of FIG. 10, the electronic component 40 was sheared in the arrow direction at a rate of 0.5 mm/minute, and the shear strength was measured. (b) of FIG. 10 is a cross-sectional view taken along the line Vb-Vb in (a) of FIG. 10. From the average value of the shear strengths at 20 places at which the polymer compact 31 and the copper wiring 33 were bonded to each other, the adhesiveness between the polymer compact 31 and the copper wiring 33 was evaluated. The results are shown in Table 1.

(Production of Electronic Component 44)

Figure 8:
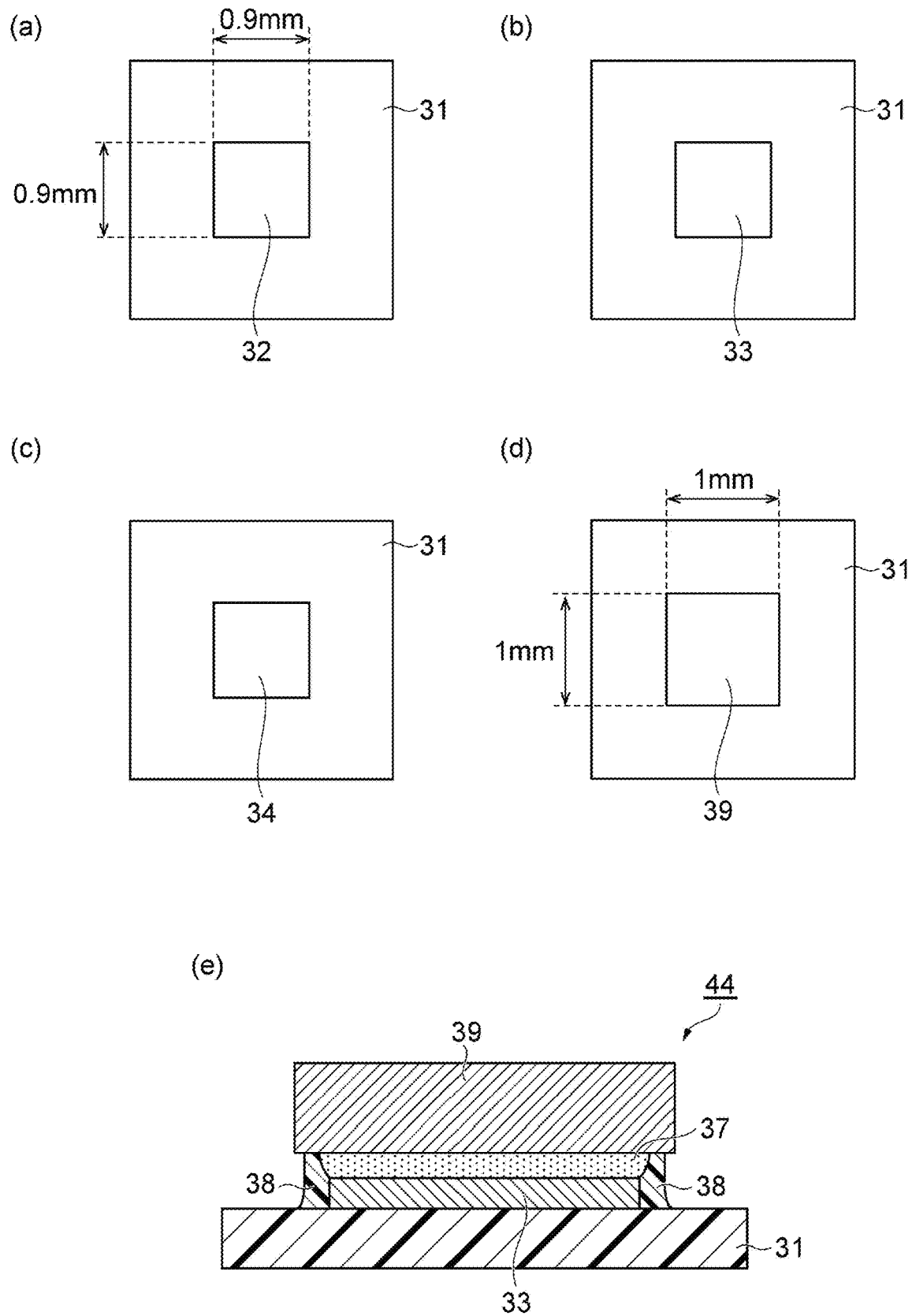
FIG. 8 is schematic views showing a method for manufacturing an electronic component in an example.

The above-described polymer compact was prepared, a stainless steel metal mask (thickness: 50 µm) having one 0.9 mm×0.9 mm square opening was placed on the polymer compact 31 as shown in (a) of FIG. 8, and the copper paste a1 was applied by stencil printing in which a metal squeegee was used, thereby obtaining a member on which a copper paste layer 32 was formed. The obtained member was set in a tube furnace (manufactured by AVC Co., Ltd.), and an argon gas was caused to flow at 1 L/minute to substitute the air with the argon gas. After that, the copper paste layer was sintered by performing a sintering treatment under conditions in which the temperature was raised for 10 minutes and held at 180° C. for 60 minutes under the flow of a hydrogen gas at 300 mL/minute, and a copper wiring 33 was formed as shown in (b) of FIG. 8.

Subsequently, the solder paste was applied onto the copper wiring to form a solder paste layer 34 as shown in (c) of FIG. 8. Subsequently, a copper substrate 39 (1 mm×1 mm×0.3 mmt) was disposed (mounted) on the upper part of the solder paste layer 34 as shown in (d) of FIG. 8, thereby obtaining a member. Subsequently, in the atmosphere, the member shown in (d) of FIG. 8 was put on a hot plate that had been heated to 170° C. and left to stand for 15 minutes. The cross-sectional shape of an electronic component 44 obtained by leaving the member to stand in the atmosphere is shown in (e) of FIG. 8. The copper substrate 39 and the copper wiring 33 were bonded to each other with a solder layer 37, and the outer circumferential portion of the solder layer 37 was reinforced with a resin layer 38.

Figure 9:
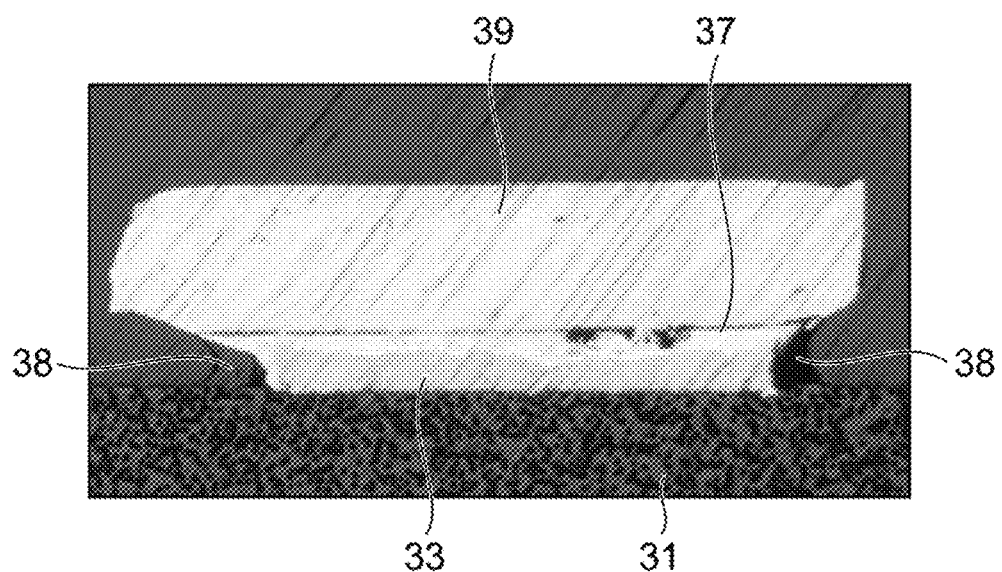
FIG. 9 is cross-sectional observation views of the electronic component produced in the example.

The observation result of the cross section of the electronic component 44 with an optical microscope is shown in FIG. 9. The copper substrate 39 and the copper wiring 33 were bonded to each other through the solder layer 37, and the resin layer 38 was formed at the outer circumference of the solder layer 37.

(Evaluation of Adhesiveness)

Figure 11:
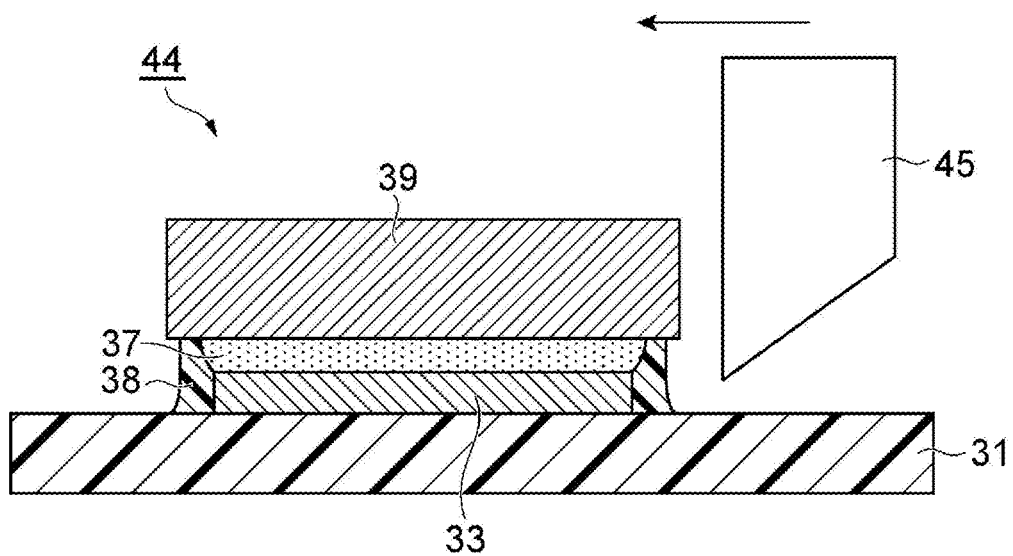
FIG. 11 is a schematic view for describing the method for measuring the shear strength in the example.

For the electronic component 44, the connection strength (shear strength) was measured using the bond tester. Specifically, the shear tool 45 was disposed at a shear height of 50 μm over the electronic component 44 as shown in FIG. 11, the electronic component 44 was sheared in the arrow direction at a rate of 0.5 mm/minute, and the shear strength was measured. From the average value of the shear strengths at 20 places at which the polymer compact 31 and the copper wiring 33 were bonded to each other, the adhesiveness between the polymer compact 31 and the copper wiring 33 was evaluated. The results are shown in Table 1.

Example 2

An electronic component 40 and an electronic component 44 were produced in the same manner as in Example 1 except that the sintering temperature of the copper paste layer 32 was changed from 180° C. to 225° C., and the adhesiveness was evaluated.

Example 3

An electronic component 40 and an electronic component 44 were produced in the same manner as in Example 1 except that the copper paste layer 32 was formed using the copper paste a2 instead of the copper paste a1 and the copper paste layer 32 was sintered in the atmosphere at 180° C. for 10 minutes, and the adhesiveness was evaluated.

Comparative Example 1

Figure 12:
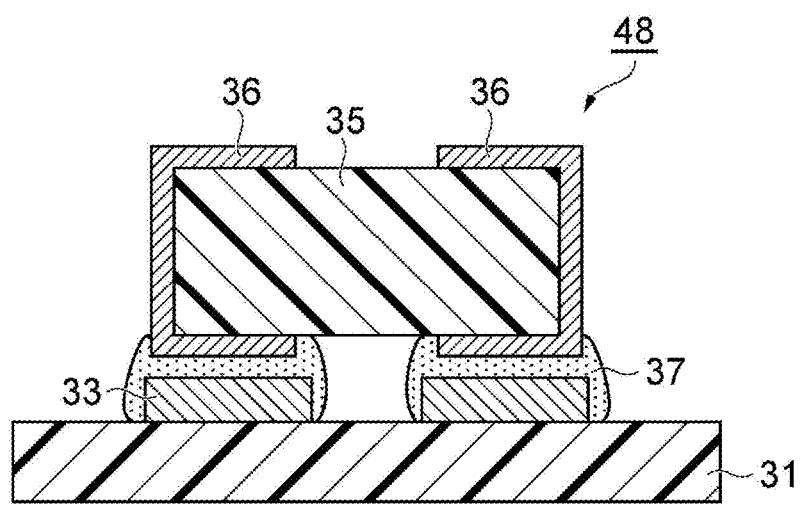
FIG. 12 is a cross-sectional image view of an electronic component produced in a comparative example.
Figure 13:
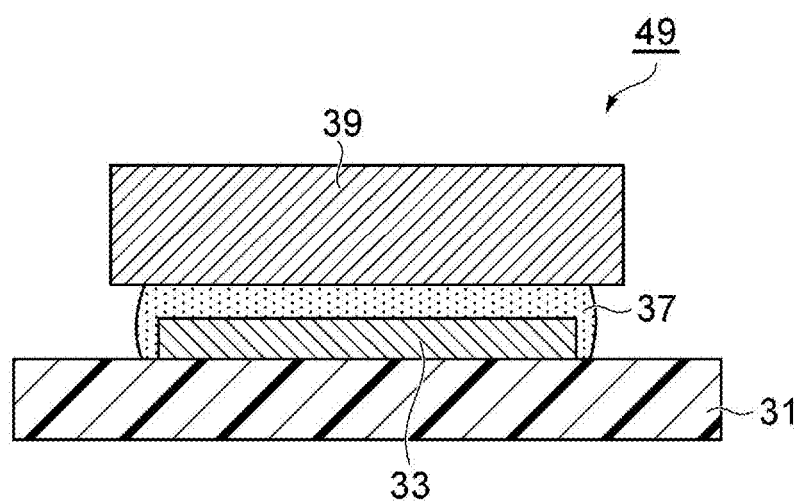
FIG. 13 is a cross-sectional image view of the electronic component produced in the comparative example.

An electronic component 48 shown in FIG. 12 and an electronic component 49 shown in FIG. 13 were produced in the same manner as in Example 1 except that the solder layer 37 was formed using solder particles "Sn42-Bi58 particles" alone instead of the solder paste, and the adhesiveness was evaluated.

Comparative Example 2

An electronic component 48 and an electronic component 49 were produced in the same manner as in Example 2 except that the solder layer 37 was formed using solder particles "Sn42-Bi58 particles" alone instead of the solder paste, and the adhesiveness was evaluated.

Comparative Example 3

An electronic component 48 and an electronic component 49 were produced in the same manner as in Example 3 except that the solder layer 37 was formed using solder particles "Sn42-Bi58 particles" alone instead of the solder paste, and the adhesiveness was evaluated.

TABLE 1

| | | Example 1 | Example 2 | Example 3 | Comparative Example 1 | Comparative Example 2 | Comparative Example 3 |
|---|---|---|---|---|---|---|---|
| Ceramic capacitor | Initial bonding strength (MPa) | 7.7 | 7.6 | 6.3 | 2.2 | 2.2 | 1.4 |
| Copper substrate | Initial bonding strength (MPa) | 7.5 | 7.5 | 6.2 | 2.3 | 2.3 | 1.3 |
| | Bonding strength after 100 hours (MPa) | 7.2 | 7.2 | 5.8 | 0.3 | 1.8 | 0.9 |
| | Bonding strength after 300 hours (MPa) | 7.5 | 7.5 | 5.6 | 0.1 | 1.7 | 0.8 |
| | Bonding strength after 1000 hours (MPa) | 7.3 | 7.3 | 5.7 | 0.1 | 1.3 | 0.8 |

REFERENCE SIGNS LIST 1, 31 Polymer compact
2, 32 Copper paste layer
3, 24, 33 Copper wiring
3a Pore part
4 Solder particle
5 Resin component
6, 34 Solder paste layer
7, 13, 15, 17, 43 Resin-loaded part
8 Electronic element
35 Ceramic capacitor
9, 36 Electrode
10, 40, 44, 48, 49 Electronic component
11, 37 Solder layer
12, 14, 16, 38 Resin layer
39 Copper substrate
42 Cast resin
45 Shear tool

What is claimed is:

1. A method for manufacturing an electronic component, the method comprising:
- a first step of applying a metal paste containing metal particles onto a polymer compact in a prescribed pattern to form a metal paste layer;
- a second step of sintering the metal particles to form a metal wiring;
- a third step of applying a solder paste containing solder particles and a resin component onto the metal wiring to form a solder paste layer;
- a fourth step of disposing an electronic element on the solder paste layer; and
- a fifth step of heating the solder paste layer so as to form a solder layer bonding the metal wiring and the electronic element, and so as to form a resin layer covering at least a portion of the solder layer, wherein the solder layer covers a side surface of the metal wiring,
- wherein the metal particles comprises first copper particles having a particle diameter of 2.0 µm or more and second copper particles having a particle diameter of 0.8 µm or less; and
- wherein the polymer compact is made of a liquid crystal polymer or polyphenylene sulfide.

2. The method for manufacturing an electronic component according to claim 1,
   wherein, in the second step, the metal wiring has pores.

3. The method for manufacturing an electronic component according to claim 2,
   wherein, in the third step, at least some of the pores are loaded with the resin component.

4. The method for manufacturing an electronic component according to claim 1,
   wherein the solder particles contain tin.

5. The method for manufacturing an electronic component according to claim 4,
   wherein the solder particles are made of at least one tin alloy selected from a group consisting of an In—Sn alloy, an In—Sn—Ag alloy, a Sn—Bi alloy, a Sn—Bi—Ag alloy, a Sn—Ag—Cu alloy, and a Sn—Cu alloy.

6. The method for manufacturing an electronic component according to claim 1,
   wherein the electronic element has an electrode containing at least one element selected from a group consisting of copper, nickel, palladium, gold, platinum, silver, and tin on an outermost surface, and
   in the fourth step, the electronic element is disposed such that the electrode is in contact with the solder paste layer.

* * * * *